US 8,902,642 B2

(12) United States Patent
Mitou

(10) Patent No.: US 8,902,642 B2
(45) Date of Patent: Dec. 2, 2014

(54) SEMICONDUCTOR DEVICE INCORPORATING MULTI-VALUE MAGNETIC MEMORY CELLS

(75) Inventor: Hideki Mitou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 191 days.

(21) Appl. No.: 13/552,075

(22) Filed: Jul. 18, 2012

(65) Prior Publication Data
US 2013/0021843 A1 Jan. 24, 2013

(30) Foreign Application Priority Data

Jul. 19, 2011 (JP) .................................. 2011-158118

(51) Int. Cl.
G11C 11/00 (2006.01)
G11C 11/16 (2006.01)

(52) U.S. Cl.
CPC .......... G11C 11/161 (2013.01); G11C 11/1673 (2013.01)
USPC ............................ 365/158; 365/171; 365/173

(58) Field of Classification Search
CPC .......................... G11C 11/161; G11C 11/1673
USPC .......................................... 365/158, 171, 173
See application file for complete search history.

(56) References Cited

U.S. PATENT DOCUMENTS

| 8,120,127 | B2 * | 2/2012 | Nagahara et al. | 257/421 |
| 8,416,611 | B2 * | 4/2013 | Fukami et al. | 365/158 |
| 8,481,339 | B2 * | 7/2013 | Nagahara et al. | 438/3 |
| 2004/0017706 | A1 | 1/2004 | Freitag et al. | |
| 2008/0080234 | A1 | 4/2008 | Iwata et al. | |
| 2013/0028015 | A1 * | 1/2013 | Matsui | 365/173 |
| 2013/0039122 | A1 * | 2/2013 | Suzuki | 365/158 |
| 2013/0064009 | A1 * | 3/2013 | Kitano | 365/158 |

FOREIGN PATENT DOCUMENTS

| JP | 2004-517504 A | 6/2004 |
| JP | 2008-90957 A | 4/2008 |

* cited by examiner

*Primary Examiner* — Pho M Luu
(74) *Attorney, Agent, or Firm* — Sughrue Mion, PLLC

(57) ABSTRACT

A semiconductor device includes a memory cell. The memory cell includes: a magnetic recording layer formed of ferromagnetic material; first and second magnetization fixed layers coupled to the magnetic recording layer; a plurality of reference layers opposed to the magnetic recording layer; and a plurality of tunnel barrier films respectively inserted between the magnetic recording layer and the reference layers. The first magnetization fixed layer has a magnetization fixed in a first direction, and the second magnetization fixed layer has a magnetization fixed in a second direction opposite to first direction. The reference layers each have a magnetization fixed in the first direction or the second direction. The reference layers and the tunnel barrier layers are positioned between the first and second magnetization fixed layers.

20 Claims, 27 Drawing Sheets

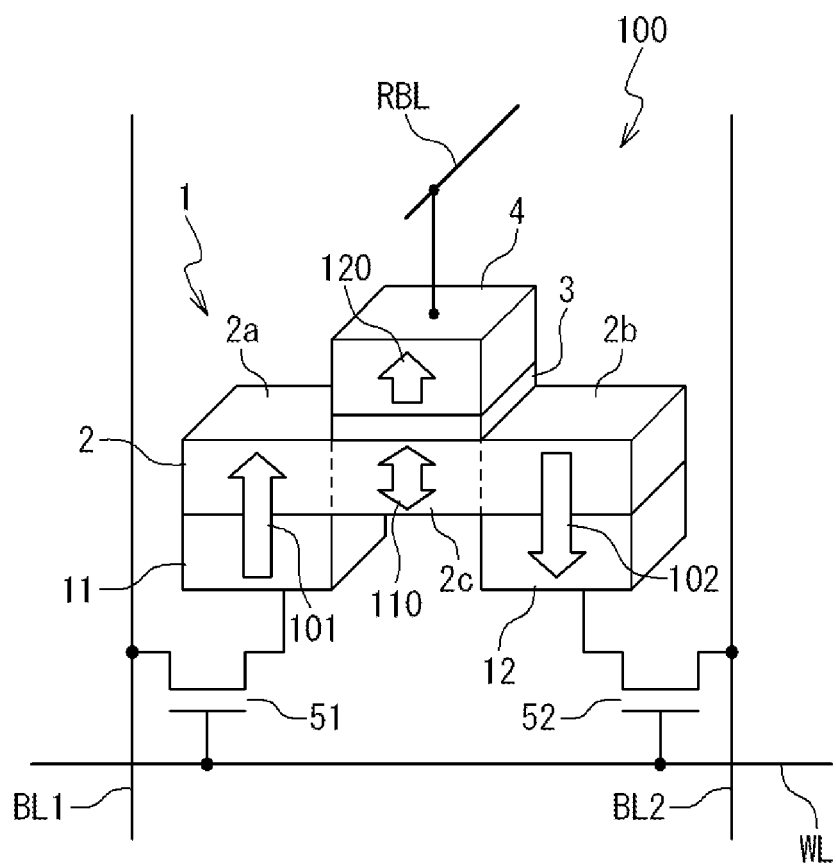

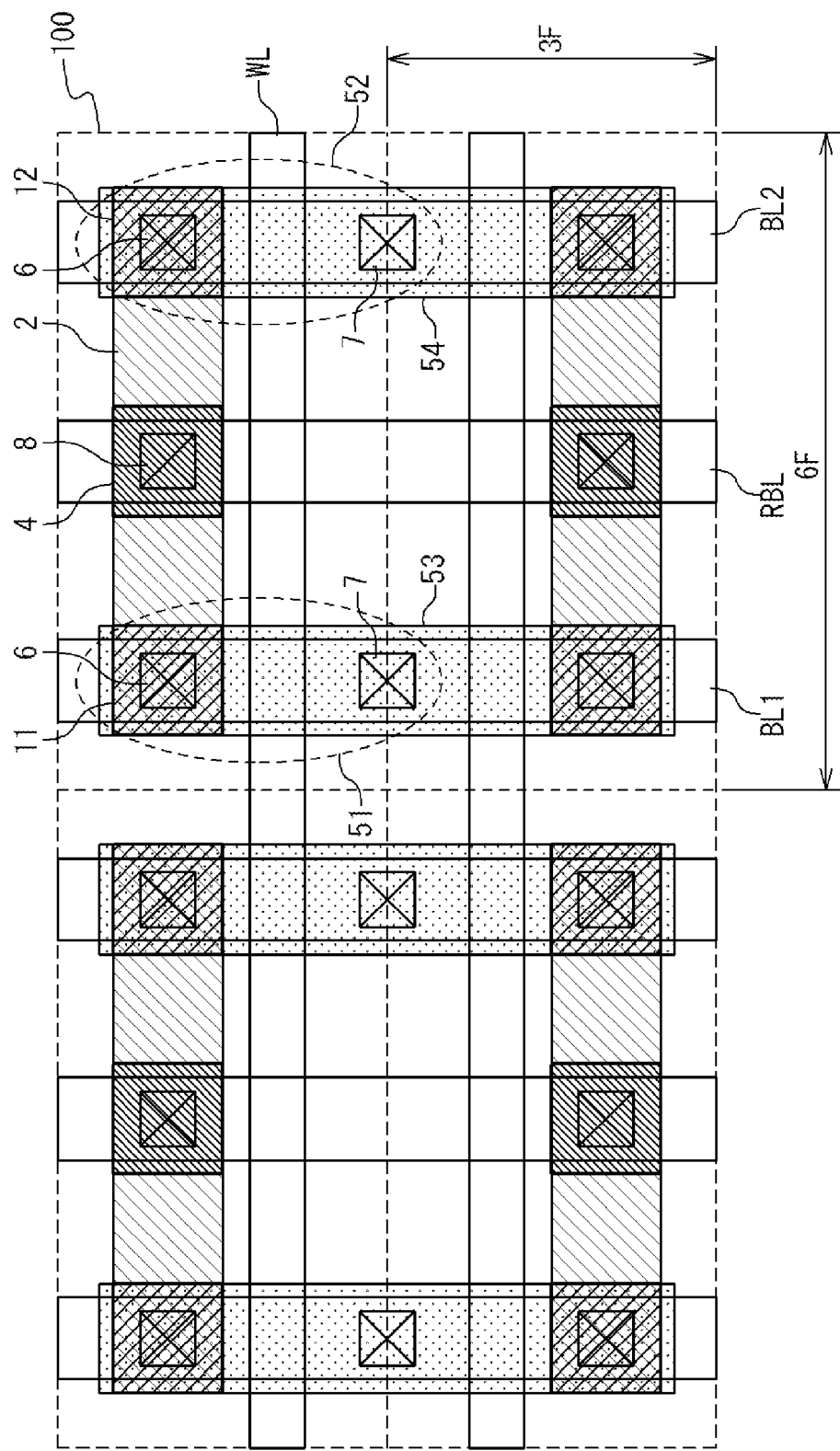

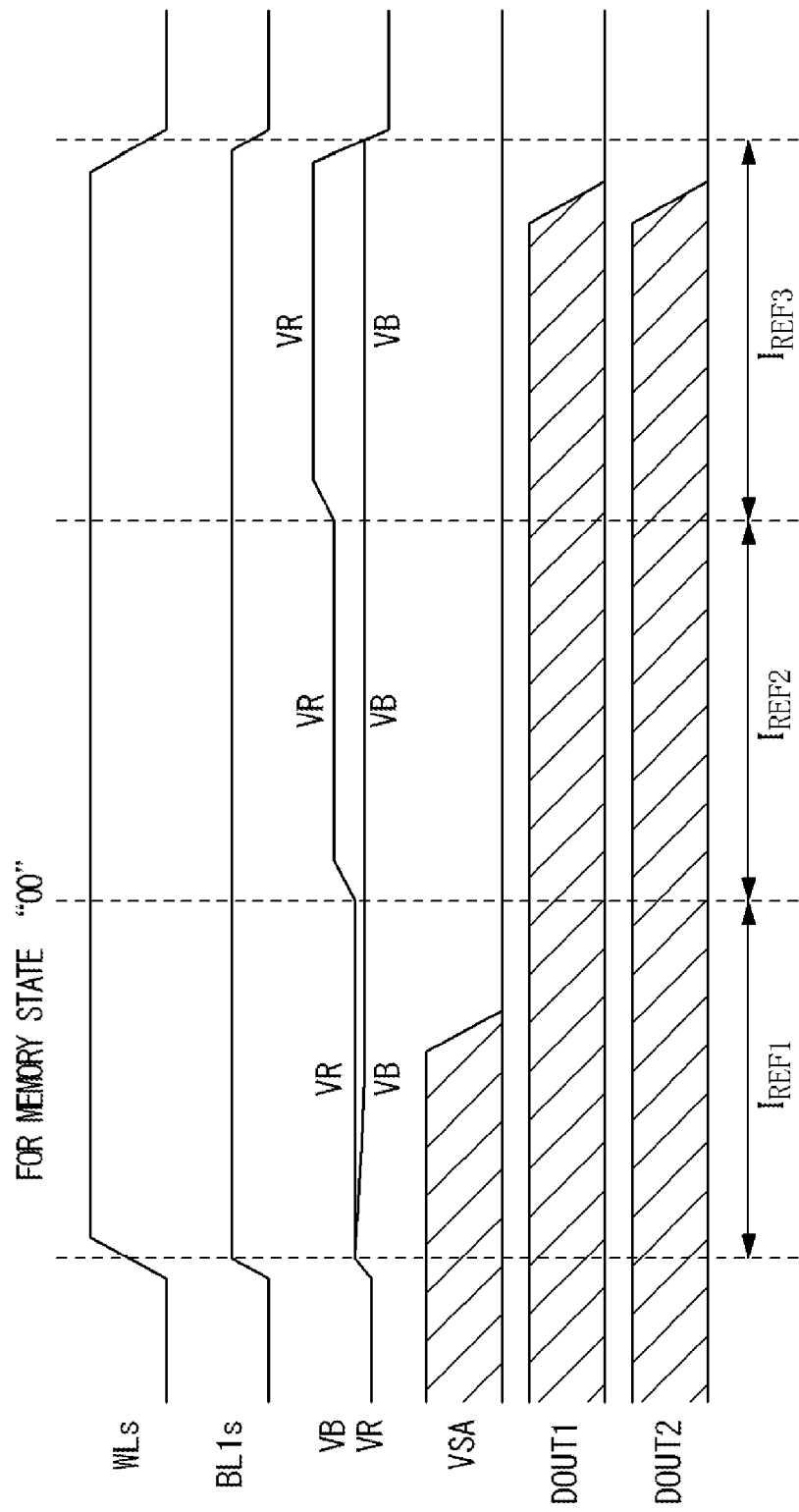

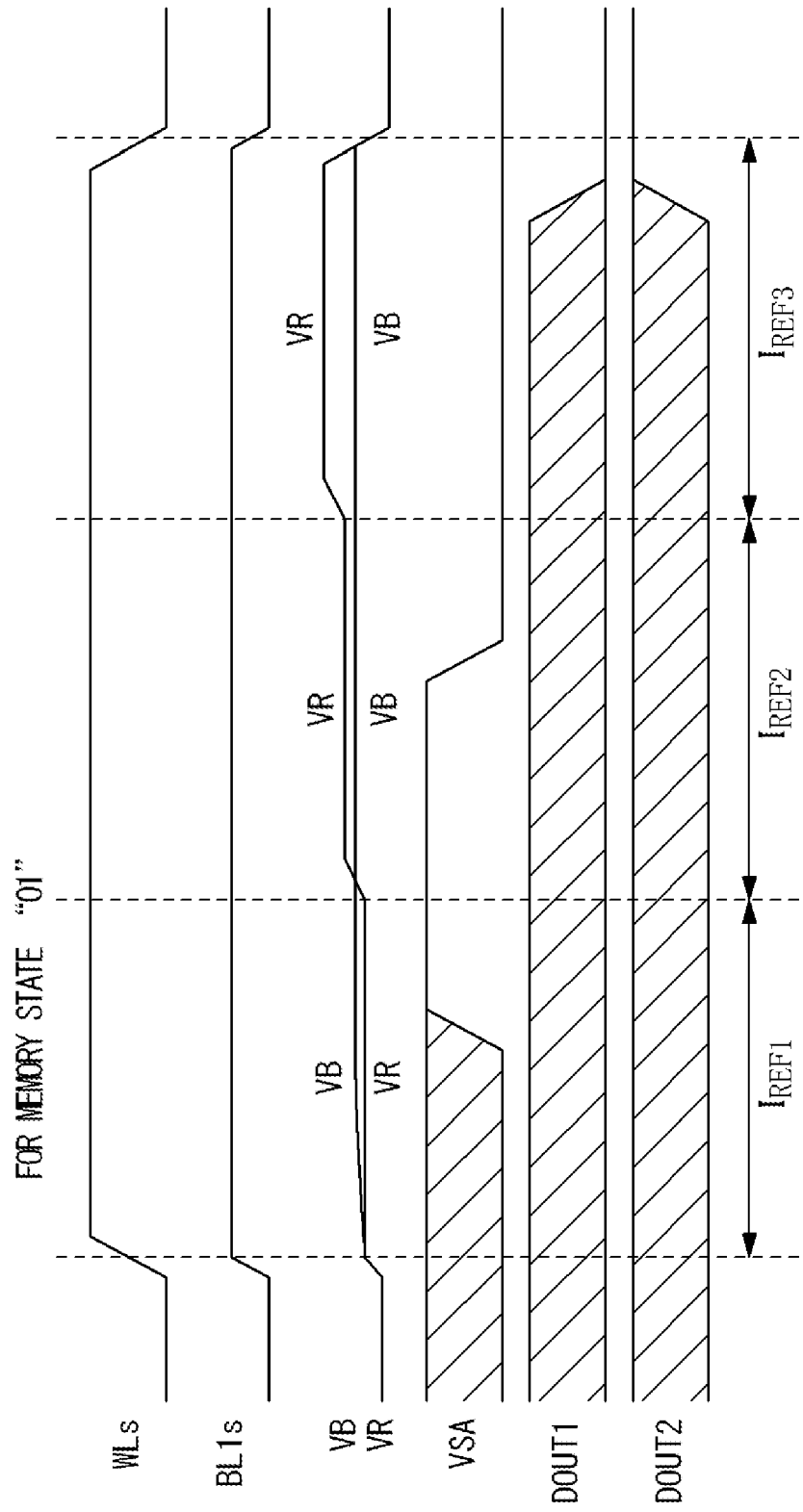

US 8,902,642 B2

SEMICONDUCTOR DEVICE INCORPORATING MULTI-VALUE MAGNETIC MEMORY CELLS

INCORPORATION BY REFERENCE

This application claims the benefit of priority based on Japanese Patent Application No. 2011-158118, filed on Jul. 19, 2012, the disclosure of which is incorporated herein by reference.

BACKGROUND

The present invention relates to semiconductor devices and magnetic random access memories (MRAMs), more particularly, to MRAM memory cells which are suitable for an operation based on magnetic domain wall motion.

Recently, the MRAM, which uses magnetoresistance effect elements as memory cells, has been proposed as one of non-volatile memories, which are a sort of semiconductor devices. Especially, magnetoresistance effect elements having a magnetic tunnel junction (which may be referred to as "MTJ", hereinafter) are often used as MRAM memory cells due to the advantage of a very large magnetoresistance effect. The magnetic tunnel junction has a laminated structure in which a non-magnetic dielectric film (hereinafter, referred to as tunnel barrier film) is disposed between two ferromagnetic films. Data are stored as the relative direction of the magnetizations of the two ferromagnetic films. In one example, the state in which the magnetizations are directed in parallel is correlated with data "0" and the state in which the magnetizations are directed in antiparallel is correlated with data "1". The electric resistance for a current flown in the direction perpendicular to the film surface of the laminated structure varies depending on the relative angle of the magnetizations of the two ferromagnetic films. The electric resistance of the magnetic tunnel junction takes the minimum value when the magnetizations are directed in parallel, and takes the maximum value when the magnetizations are directed in antiparallel. The data read is achieved by using the variations in the electric resistance. The MRAM attracts a lot of attention in the field of embedded memories, and there is a demand for the high-speed random access of the MRAM as replacements of SRAMs (static random access memory) and DRAMs (dynamic random access memory). Disclosure of a magnetic memory device using MTJs is also found in Japanese Patent Application Publication No. JP-A 2008-90957.

Various MRAMs are known in the art and one type of the MRAM is the magnetic domain wall motion type. The magnetic domain wall motion type MRAM achieves data writing by moving the magnetic domain wall through the spin transfer effect of spin-polarized electrons with a write current flown in the in-plane direction of a ferromagnetic film and thereby directing the magnetization of the ferromagnetic film in the direction depending on the direction of the write current. Such a magnetic domain wall motion type MRAM is disclosed in 2009 Symposium on VLSI Technology Digest of Technical Papers 12A-2.

FIG. 1A shows the structure of a memory cell of the magnetic domain wall motion type MRAM disclosed in this document. The memory cell shown in FIG. 1A includes a magnetoresistance effect element 1 and NMOS transistors 51 and 52. The magnetoresistance effect element 1 includes: magnetization fixed layers 11, 12; a magnetic recording layer 2 disposed on the magnetization fixed layers 11, 12; a reference layer 4; and a tunnel barrier layer 3 disposed between the magnetic recording layer 2 and the reference layer 4. The magnetization fixed layers 11, 12 and the reference layer 4 are each formed of a ferromagnetic film having a fixed magnetization. The magnetic recording layer 2 is also formed of a ferromagnetic film. The magnetizations of regions 2a and 2b of the magnetic recording layer 2, which are coupled with the magnetization fixed layers 11 and 12, respectively, are fixed by the exchange coupling with the magnetization fixed layers 11 and 12. Hereinafter, the regions 2a and 2b may be referred to as magnetization fixed regions 2a and 2b, respectively. A region 2c between the magnetization fixed regions 2a and 2b has a reversible magnetization. Hereinafter, the region 2c may be referred to as magnetization reversible region 2c. The reference layer 4, the tunnel barrier layer 3 and the magnetization reversible region 2c form an MTJ.

The drain of the NMOS transistor 51 is connected to the magnetization fixed layer 11 and the source of the NMOS transistor 51 is connected to a write bitline BL1. The NMOS transistor 52 has a drain connected to the magnetization fixed layer 12 and a source connected to a write bitline BL2. The gates of the NMOS transistors 51 and 52 are commonly connected to the word line WL. The reference layer 4 is connected to the grounding line GND in the structure shown in FIG. 1A. In FIG. 1A, the arrows 101, 102, 110 and 120 indicate the directions of the magnetizations of the respective layers.

The data writing is achieved by flowing a write current between the write bitlines BL1 and BL2 with the NMOS transistors 51 and 52 turned on, and thereby switching the magnetization direction 110 of the magnetization reversible region 2c of the magnetic recording layer 2. The data reading is, on the other hand, achieved by flowing a read current from the write bitline BL1 (or BL2) to the ground via the MTJ of the magnetoresistance effect element 1 and comparing the read current with a reference current by a sense amplifier (not shown). The ground line GND is shared over the memory array.

FIG. 1B shows a modification of the structure of the MRAM memory cell. In the MRAM memory cell shown in FIG. 1B, the reference layer 4 is connected to a read bitline RBL, which is provided for each column, instead of the grounding line GND. The high-speed read from an MRAM memory cell requires reduction in the capacitance of the interconnection used for data read, and the structure shown in FIG. 1B, in which a read bitline RBL is provided for each column, is suitable for the high-speed operation.

FIG. 2A is a plan view showing the layout of the memory cell of the magnetic domain wall motion type MRAM shown in FIG. 1A; four memory cells are shown in FIG. 2A. The word lines WL are provided in the form of polysilicon gates and disposed to intersect diffusion layers 53 and 54. Each NMOS transistor 51 is formed by using a word line WL and a diffusion layer 53, and each NMOS transistor 52 is formed by using a word line WL and a diffusion layer 54. The magnetization fixed layers 11 and 12 are each connected to the drains of the NMOS transistors 51 and 52, respectively, via via-contacts 6. Furthermore, the sources of the NMOS transistors 51 and 52 are connected to the write bitlines BL1 and BL2, respectively via via-contacts 7. Each reference layer 4 is connected to the grounding line GND via a via-contact 8. The grounding lines GND are disposed in parallel to the word lines WL (that is, perpendicularly to the write bitlines BL1 and BL2). In the layout shown in FIG. 2A, the area of each memory cell is 12 $F^2$ (=4 F×3 F).

FIG. 2B is, on the other hand, a plan view showing the layout of the memory cell of the magnetic domain wall motion type MRAM shown in FIG. 1B; four memory cells are also shown in FIG. 2B. In the layout shown in FIG. 2B, read bitlines RBL which extend in the direction parallel to the write bitlines BL1 and BL2 are disposed in place of the grounding lines GND. Each reference layer 4 is connected to a read bitline RBL via a via-contact 8. In the layout shown in FIG. 2B, the area of each memory cell is 18 $F^2$ (=6 F×3 F).

Although the structure shown in FIGS. 1B and 2B, in which a read bitline RBL is provided for each column of memory cells, is suitable for reducing the interconnection capacitance and thereby enhancing the speed of the read operation, this structure undesirably enlarges the area of each memory cell due to the increase of the number of the interconnections. It would be advantageous if the high-speed read operation is achieved with a reduced memory cell size.

It should be noted that a technique for reducing the size of memory cell is disclosed in Japanese Translation of PCT application No. 2004-517504 A, for example; however, this technique is not applicable to the magnetic domain wall motion type MRAM.

SUMMARY

In one embodiment, a semiconductor device includes a memory cell. The memory cell includes: a magnetic recording layer formed of ferromagnetic material; first and second magnetization fixed layers coupled to the magnetic recording layer; a plurality of reference layers opposed to the magnetic recording layer; and a plurality of tunnel barrier films respectively inserted between the magnetic recording layer and the reference layers. The first magnetization fixed layer has a magnetization fixed in a first direction, and the second magnetization fixed layer has a magnetization fixed in a second direction opposite to first direction. The reference layers each have a magnetization fixed in the first direction or the second direction. The reference layers and the tunnel barrier layers are positioned between the first and second magnetization fixed layers.

This embodiment offers a magnetic domain wall motion type MRAM suitable for a high-speed read operation while effectively reducing the area of the memory cell.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1B shows another known memory cell structure of a magnetic random access memory;

FIG. 2B is a diagram showing the layout of the memory cell shown in FIG. 1B;

FIG. 12A is a timing chart showing an exemplary read operation from a selected memory cell storing data "00" in the first embodiment;

FIG. 12B is a timing chart showing an exemplary read operation from a selected memory cell storing data "01" in the first embodiment;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 3:
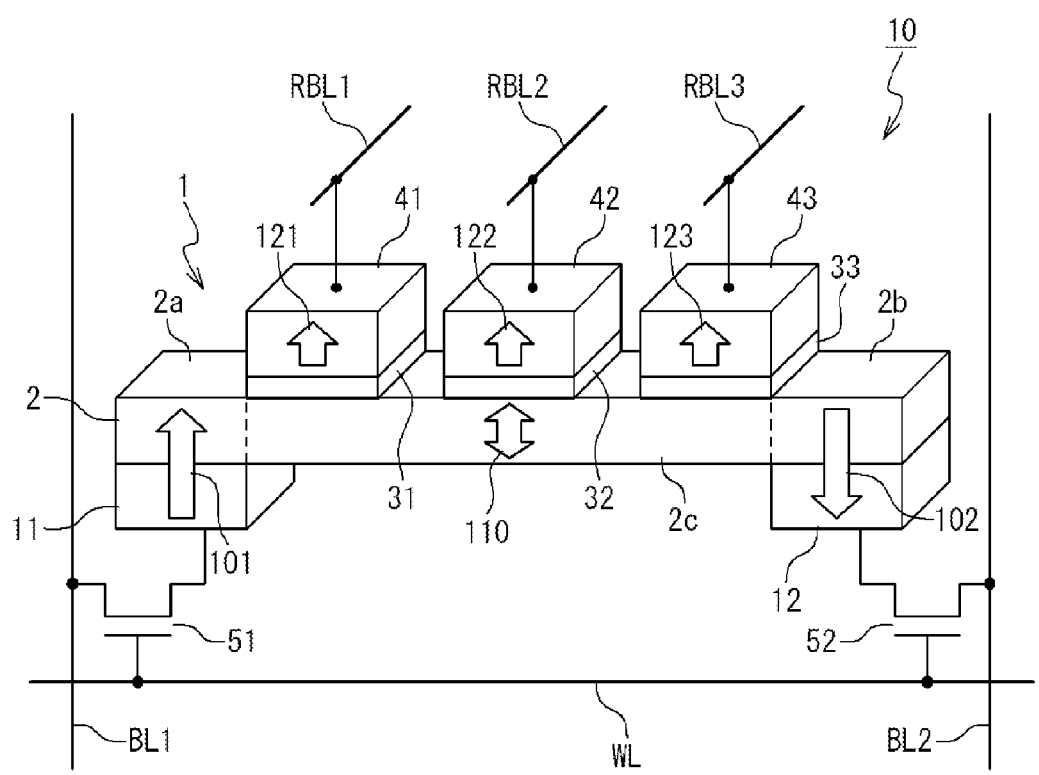
FIG. 3 is a diagram showing an exemplary structure of a memory cell of a magnetic random access memory according to a first embodiment.

FIG. 3 is a diagram showing an exemplary structure of a memory cell 10 of a magnetic random access memory of a first embodiment. The memory cell 10 includes a magnetoresistance effect element 1 and NMOS transistors 51 and 52. The magnetoresistance effect element 1 includes: magnetization fixed layers 11, 12; a magnetic recording layer 2 formed on the upper faces of the magnetization fixed layers 11 and 12; reference layers 41, 42, 43; and tunnel barrier films 31, 32 and 33 disposed between the magnetic recording layer 2 and the reference layers 41, 42 and 43, respectively.

The magnetization fixed layers 11 and 12 are each formed of ferromagnetic material having a fixed magnetization. The magnetizations of the magnetization fixed layers 11 and 12 are directed in the opposite directions. In this embodiment, the magnetization of the magnetization fixed layer 11 is fixed in the upward direction and the magnetization of the magnetization fixed layer 12 is fixed in the downward direction.

The magnetic recording layer 2 is also formed of ferromagnetic material. The magnetizations of regions 2a and 2b of the magnetic recording layer 2, which are coupled to the magnetization fixed layers 11 and 12, respectively, are fixed by exchange coupling with the magnetization fixed layers 11 and 12. Hereinafter, the regions 2a and 2b may be referred to as magnetization fixed regions 2a and 2b, respectively. The magnetization of the magnetization fixed region 2a is fixed in the upward direction as is the case with the magnetization fixed layer 11, and the magnetization of the magnetization fixed region 2b is fixed in the downward direction as is the case with the magnetization fixed layer 12. The magnetization direction of the magnetization fixed layer 11 and the magnetization fixed region 2a is indicated by the arrow 101, and the magnetization direction of the magnetization fixed layer 12 and the magnetization fixed region 2b is indicated by the arrow 102. The region 2c between the regions 2a and 2b has a magnetization reversible between the upward and downward directions. Hereinafter, the region 2c may be referred to as magnetization reversible region 2c.

The reference layers 41, 42 and 42 are each formed of ferromagnetic material having a fixed magnetization. In this embodiment, the magnetizations of the reference layers 41, 42 and 43 are fixed in the upward directions. It should be noted that the magnetizations of the reference layers 41, 42 and 43 may be fixed in the downward directions instead. The reference layers 41, 42, 43, the tunnel barrier films 31, 32, 33 and the magnetization reversible region 2c form three MTJs. The tunnel barrier layers 31, 32 and 33 are each formed of a non-magnetic dielectric film. The reference layer 41 is connected to a read bitline RBL1. Correspondingly, the reference layer 42 is connected to a read bitline RBL2 and the reference layer 43 is connected to a read bitline RBL3.

In this embodiment, the magnetization fixed layers 11, 12, the magnetic recording layer 2 and the reference layers 41, 42 and 43, each having a magnetization directed in the upward or downward direction, have a perpendicular magnetic anisotropy. It should be noted, however, that the magnetization fixed layers 11, 12, the magnetic recording layer 2 and the reference layers 41, 42 and 43 may instead have an in-plane magnetic anisotropy, that is, an in-plane magnetization. Also in this case, the magnetizations of the magnetization fixed layers 11 and 12 are fixed in the opposite directions.

The NMOS transistors 51 and 52 are used for selection of the magnetoresistance effect element 1 in the read and write operations. The NMOS transistor 51 has a drain connected to the magnetization fixed layer 11, a source connected to a write bitline BL1, and a gate connected to a word line WL. Correspondingly, the NMOS transistor 52 has a drain connected to the magnetization fixed layer 12, a source connected to a write bitline BL2, and a gate connected to the word line WL.

Figure 4:
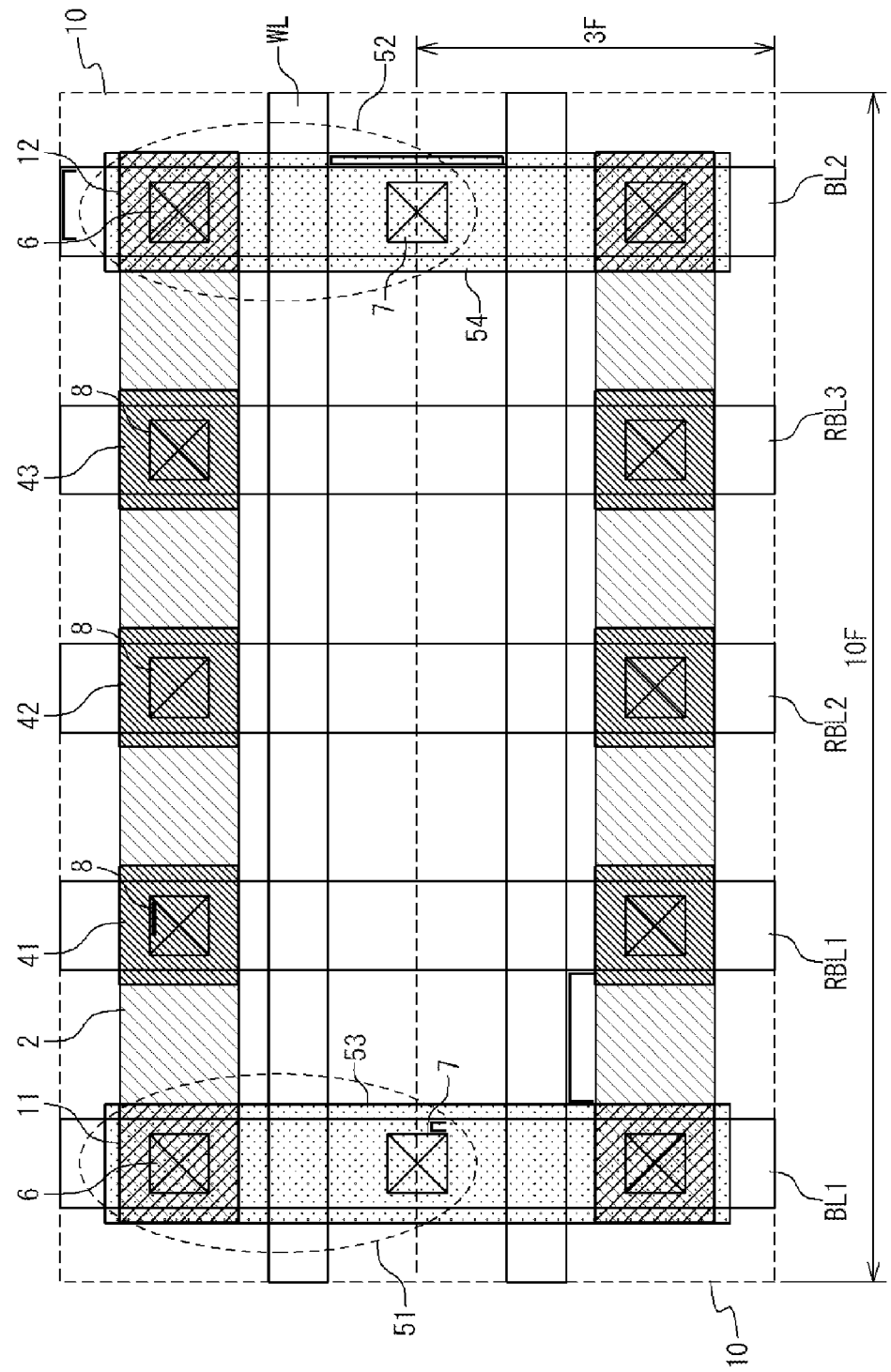
FIG. 4 is a diagram showing an exemplary layout of the memory cell shown in FIG. 3.

FIG. 4 is a plan view showing the layout of the memory cell 10 shown in FIG. 10; FIG. 4 shows the layout of two memory cells 10. The word lines WL are provided in the form of polysilicon gates, and disposed to intersect diffusion layers 53 and 54. A word line WL and a diffusion layer 53 form an NMOS transistor 51 and A word line WL and a diffusion layer 54 form an NMOS transistor 52. The magnetization fixed layers 11 and 12 are connected to the drains of the NMOS transistors 51 and 52, respectively, via via-contacts 6. Furthermore, the sources of the NMOS transistors 51 and 52 are connected to the write bitlines BL1 and BL2, respectively, via via-contacts 7. The reference layers 41, 42 and 43 are connected to the read bitlines RBL1, RBL2 and RBL3, respectively, via via-contacts 8.

Figure 1A:
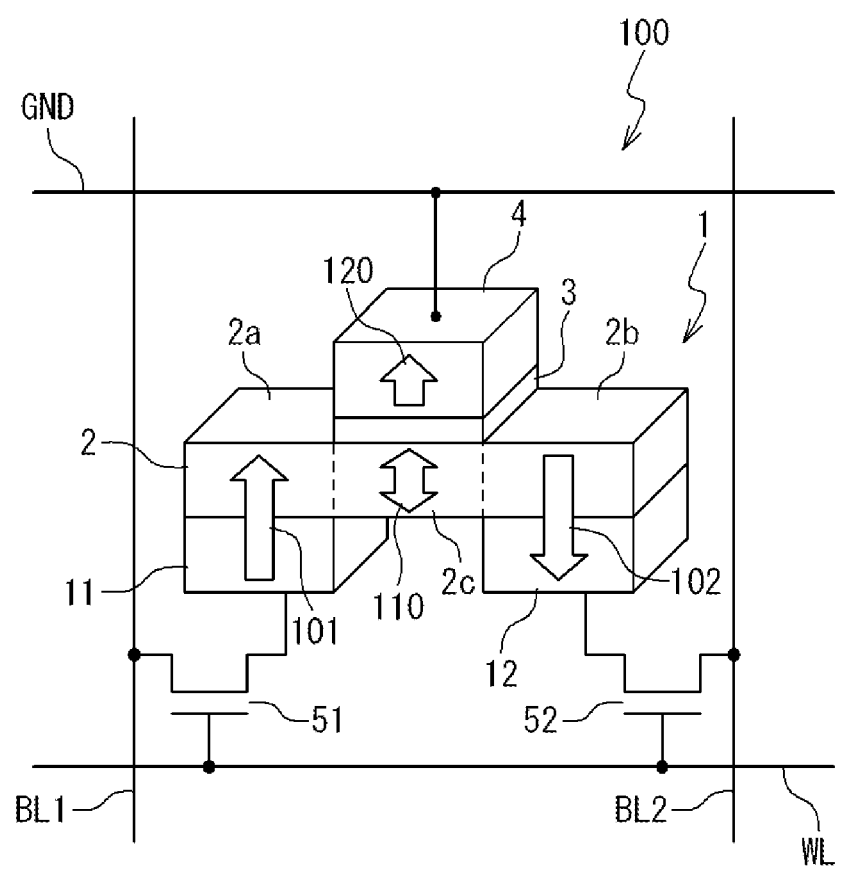
FIG. 1A shows a known memory cell structure of a magnetic random access memory.
Figure 2A:
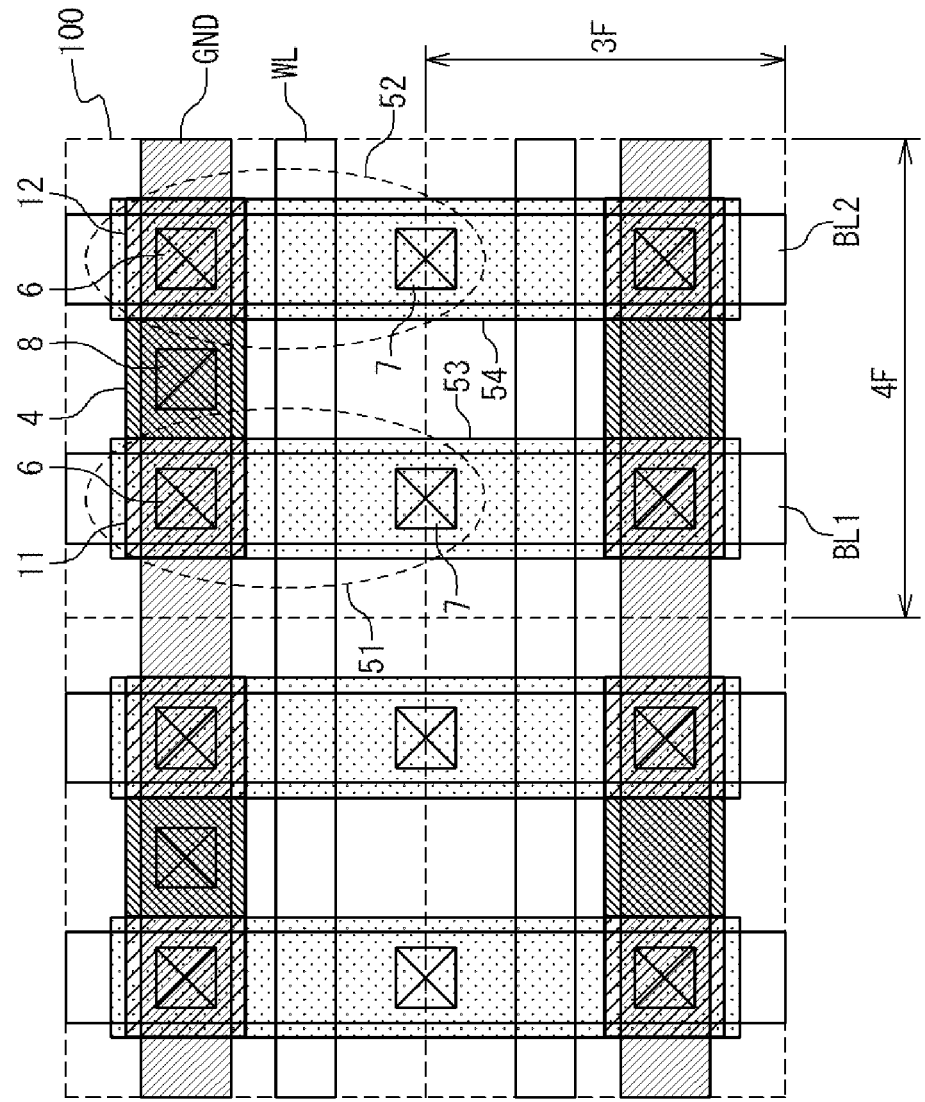
FIG. 2A is a diagram showing the layout of the memory cell shown in FIG. 1A.

The structure shown in FIGS. 3 and 4, in which the read bitlines RBL1, RBL2 and RBL3 are individually prepared, is suitable for the high-speed read operation, while reducing the area necessary for storing one bit. Specifically, the structure shown in FIGS. 3 and 4 can store two-bit data in each memory cell 10 (details will be described later). In the layout shown in FIG. 4, on the other hand, the area of each memory cell is 30 $F^2$ (=10 F×3 F). This means that the area per bit is 15 $F^2$. Although the structure shown in FIG. 2B is suitable for the high-speed read operation, the structure shown in FIG. 2B requires an area of 18 $F^2$ for one bit. As thus discussed, the magnetic random access memory of this embodiment suitably achieves a high-speed read operation, while effectively reducing the area of the memory cells.

In the following, a detailed description is given of the operation of the magnetic random access memory of the first embodiment, which can write two bit data into each memory cell 10 and read the data from each memory cell 10. Referring back to FIG. 3, the arrows 101, 102, 110 and 121 to 123 each indicate the magnetization direction at the position thereof. The memory cell 10 is configured to achieve data writing by flowing a current over the magnetic recording layer 2 via the NMOS transistors 51 and 52 and switching the magnetization direction 110 of the magnetic recording layer 110. The data reading is, on the other hand, achieved by flowing currents via the respective MTJs from the read bitlines RBL1, RBL2 and RBL3 and detecting the changes in the resistances of the respective MTJs.

The memory cell 10 is configured to store two-bit data. In other words, four states are allowed in the memory cell 10. FIGS. 5A to 5D shows the states of the memory cell 10 in the events of storing data "00", "01", "10" and "11", respectively. As is understood from these figures, the memory cell 10 stores data in the form of the position of the magnetic domain wall.

Figure 5A:
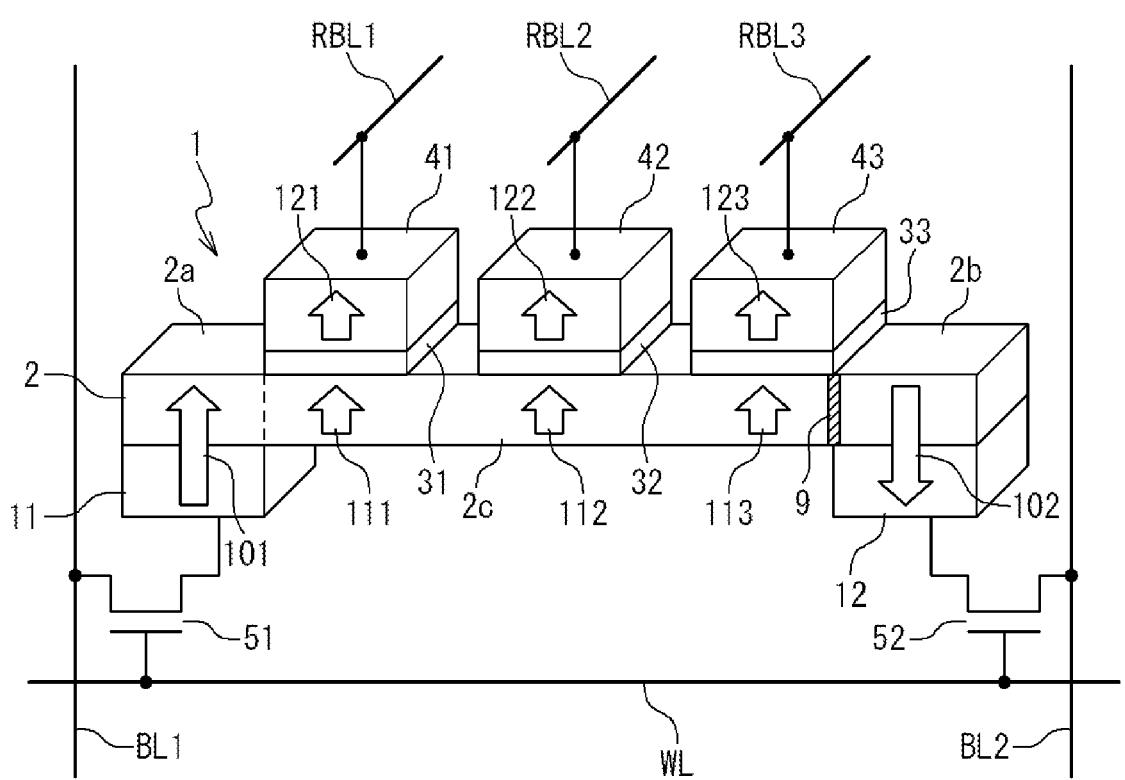
FIG. 5A is a diagram showing the state in which a memory cell stores data "00" in the first embodiment.

As shown in FIG. 5A, the magnetic domain wall 9 is positioned at a position between the reference layer 43 and the magnetization fixed region 2b, when the memory cell 10 stores data "00". In this case, as is understood from the arrows 121 to 123, the magnetization of the portion of the magnetization reversible region 2c between the magnetic domain wall 9 and the magnetization fixed region 2a is directed in the upward direction, as is indicated by the arrows 111 to 113. Accordingly, the three MTJs: the MTJ formed by the reference layer 41, the tunnel barrier film 31 and the magnetization reversible region 2c, the MTJ formed by the reference layer 42, the tunnel barrier film 32 and the magnetization reversible region 2c and the MTJ formed by the reference layer 43, the tunnel barrier film 33 and the magnetization reversible region 2c are all placed into the low-resistance state.

Figure 5B:
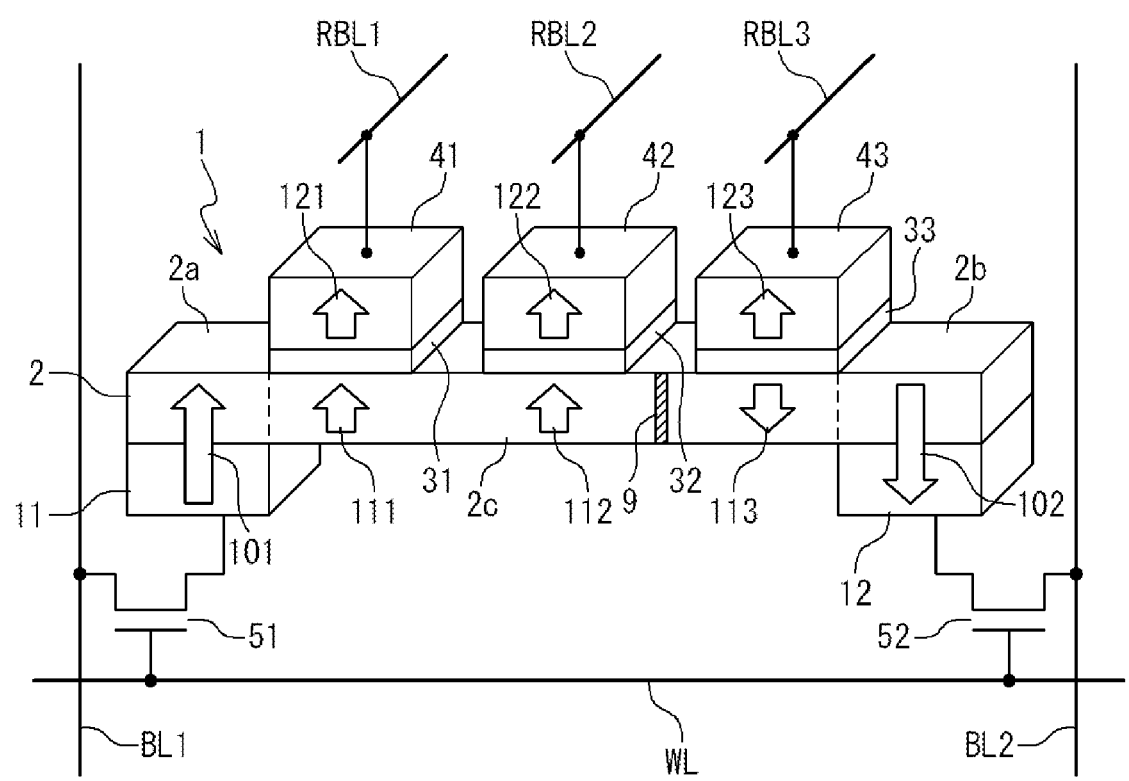
FIG. 5B is a diagram showing the state in which a memory cell stores data "01" in the first embodiment.

When the memory cell 10 stores data "01" as shown in FIG. 5B, the magnetic domain wall 9 is positioned at a position between the reference layers 42 and 43. In this case, the magnetization of the portion of the magnetization reversible region 2c between the magnetic domain wall 9 and the magnetization fixed region 2a is directed in the upward direction as is indicated by the arrows 111 and 112 and the magnetization of the portion between the magnetic domain wall 9 and the magnetization fixed region 2b is directed in the downward direction as is indicated by the arrow 113. Accordingly, the MTJ formed by the reference layer 41, the tunnel barrier film 31 and the magnetization reversible region 2c and the MTJ formed by the reference layer 42, the tunnel barrier film 32 and the magnetization reversible region 2c are placed in the low-resistance state, and the MTJ formed by the reference layer 42, the tunnel barrier film 32 and the magnetization reversible region 2c are placed in the high-resistance state.

Figure 5C:
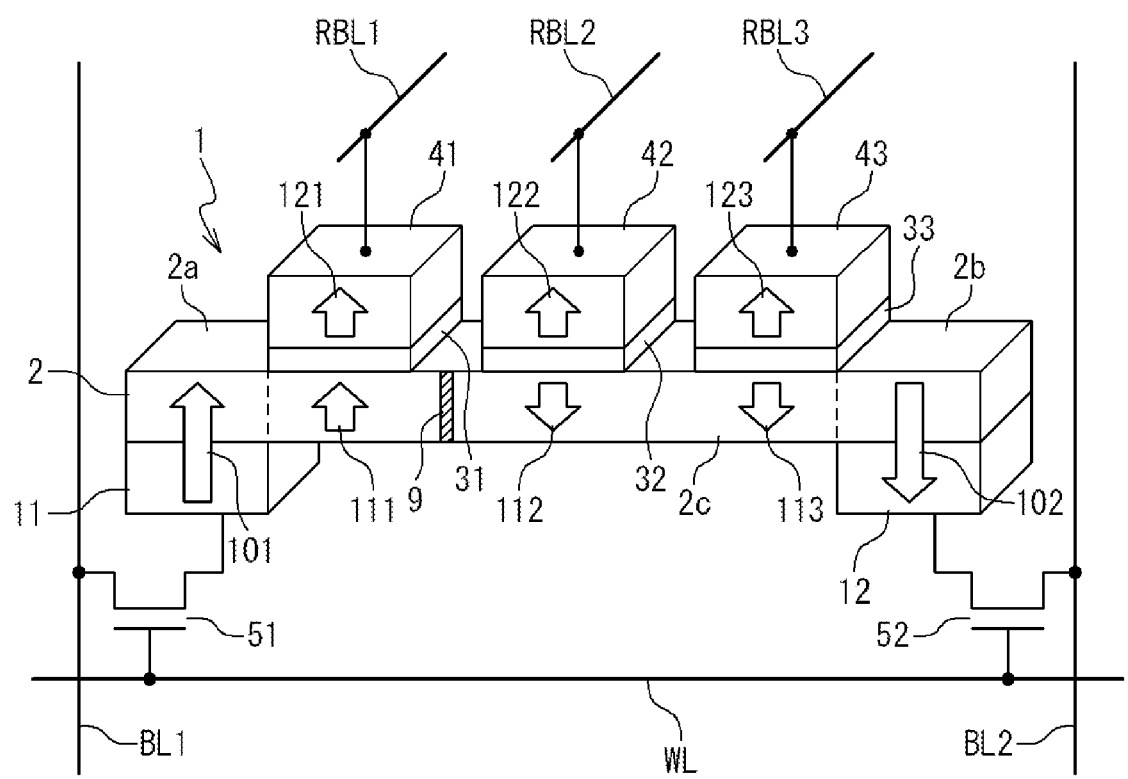
FIG. 5C is a diagram showing the state in which a memory cell stores data "10" in the first embodiment.

When the memory cell 10 stores data "10" as shown in FIG. 5C, the magnetic domain wall 9 is positioned between the reference layers 41 and 42. In this case, the magnetization of the portion of the magnetization reversible region 2c between the magnetic domain wall 9 and the magnetization fixed region 2a is directed in the upward direction, as is indicated by the arrow 111, and the magnetization of the portion between the magnetic domain wall 9 and the magnetization fixed region 2b is directed in the downward direction as is indicated by the arrows 112 and 113. Accordingly, the MTJ formed by the reference layer 41, the tunnel barrier layer 31 and the magnetization reversible region 2c is placed into the low-resistance state, while the MTJ formed by the reference layer 42, the tunnel barrier layer 32 and the magnetization reversible region 2c and the MTJ formed by the reference layer 43, the tunnel barrier layer 33 and the magnetization reversible region 2c are placed into the high-resistance state.

Figure 5D:
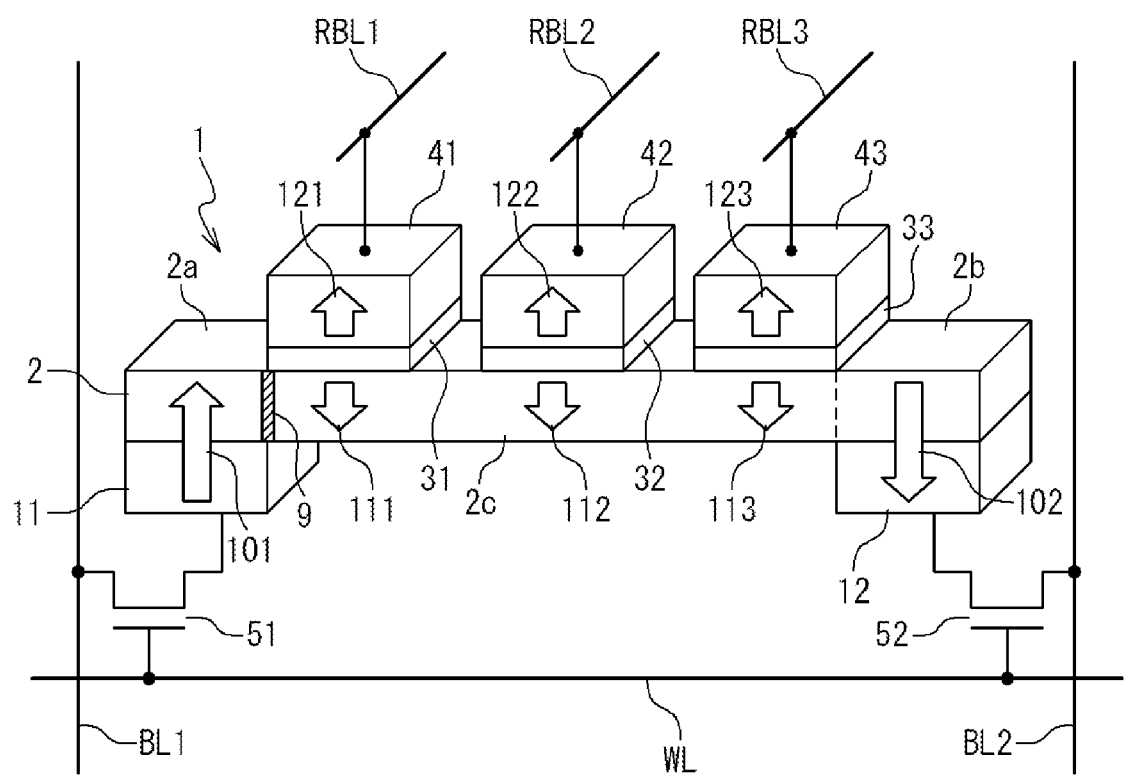
FIG. 5D is a diagram showing the state in which a memory cell stores data "11" in the first embodiment.

Finally, as shown in FIG. 5D, the magnetic domain wall 9 is positioned between the magnetization fixed region 2a and the reference layer 41 when the memory cell 10 stores data "11". In this case, the magnetization of the portion of the magnetization reversible region 2c between the magnetic domain wall 9 and the magnetization fixed region 2b is directed in the downward direction. Accordingly, the three MTJs: the MTJ formed by the reference layer 41, the tunnel barrier film 31 and the magnetization reversible region 2c, the MTJ formed by the reference layer 42, the tunnel barrier film 32 and the magnetization reversible region 2c, and the MTJ formed by the reference layer 43, the tunnel barrier film 33 and the magnetization reversible region 2c are all placed into the high-resistance state.

Figure 6A:
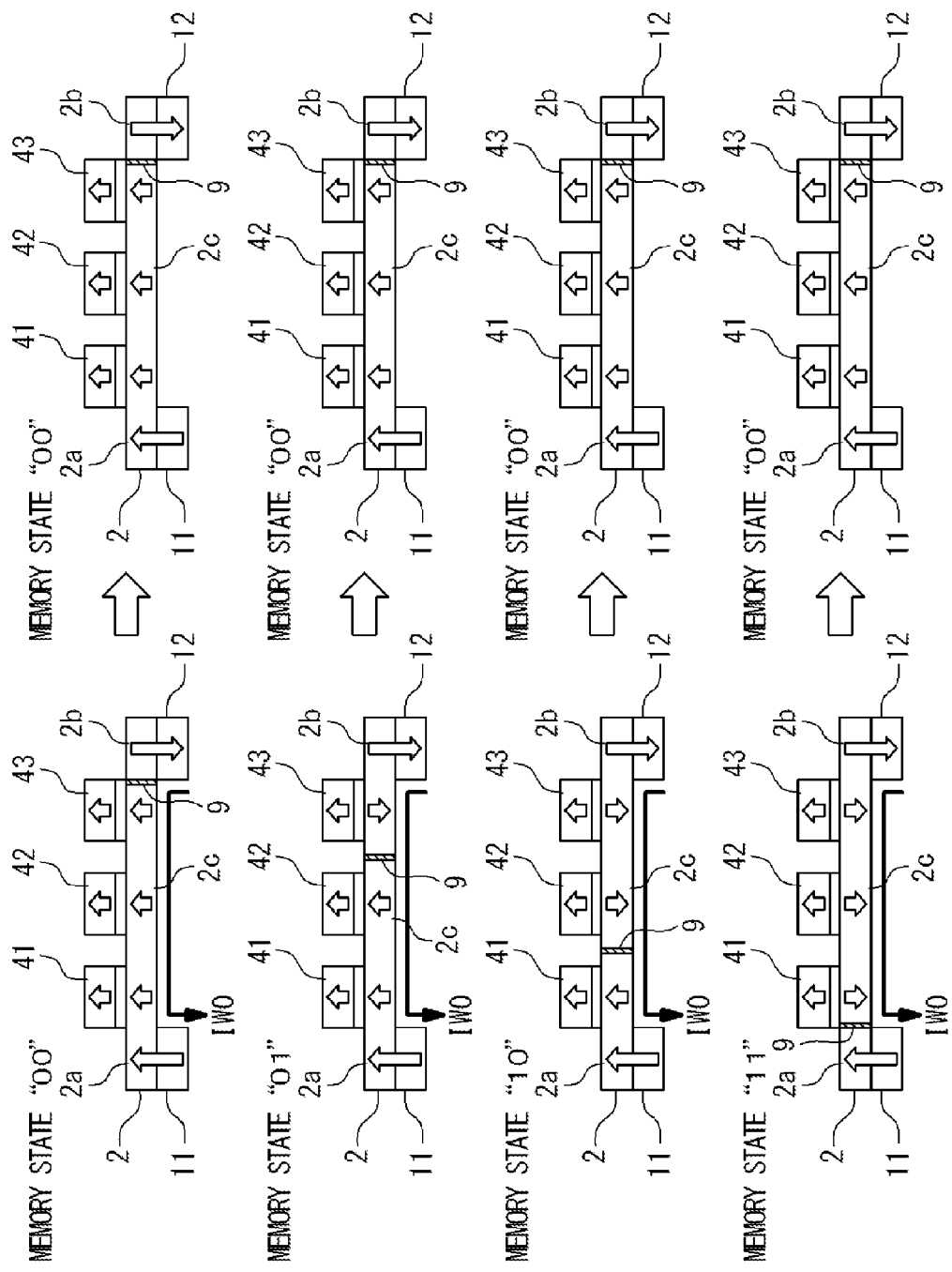
FIG. 6A is a diagram showing an exemplary operation for initializing a memory cell in the first embodiment.
Figure 6B:
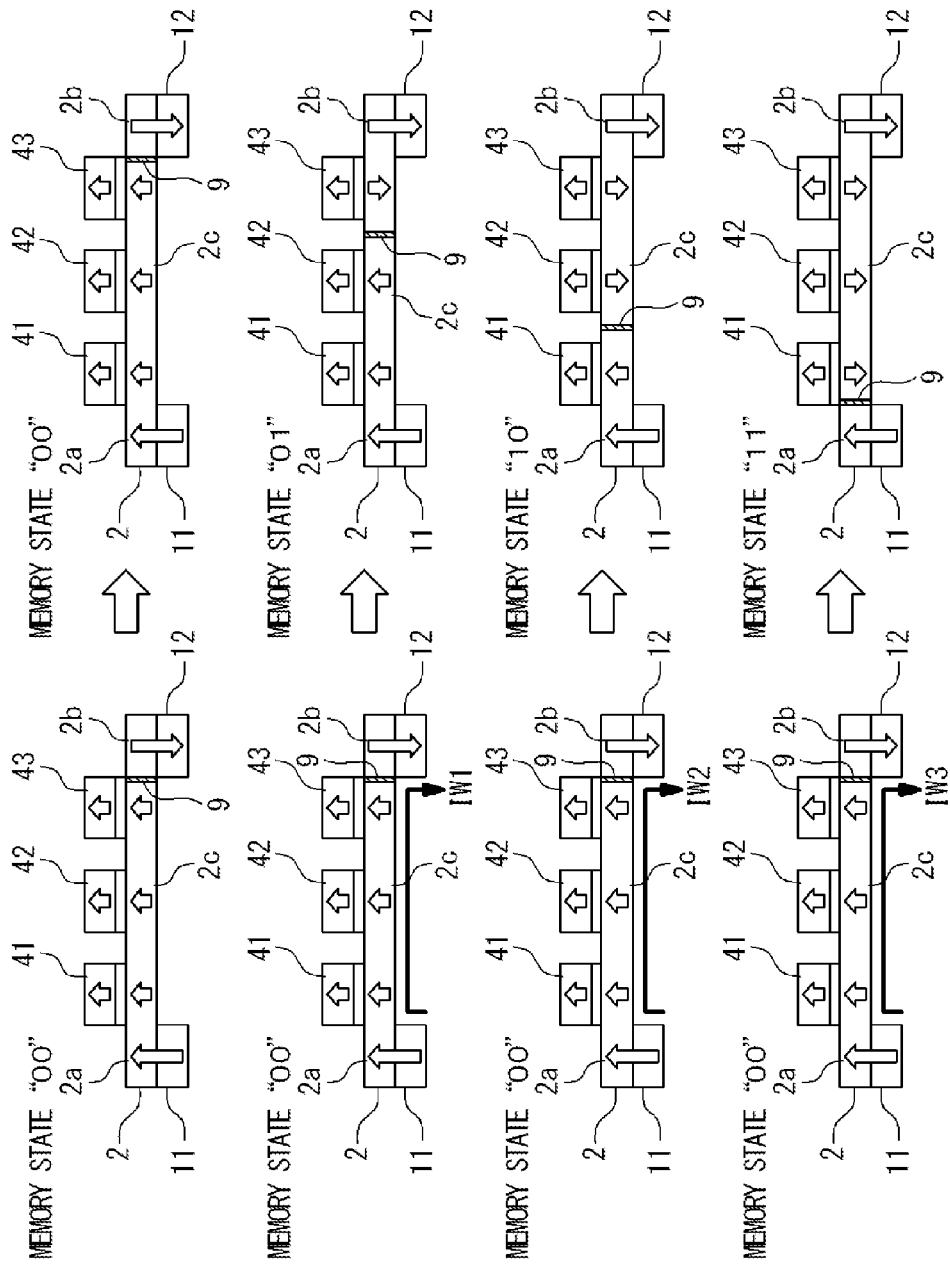
FIG. 6B is a diagram showing an exemplary operation for writing data into a memory cell in the first embodiment.

FIGS. 6A and 6B shows an exemplary write operation into a memory cell 10 in this embodiment. The memory cell 10 stores data as the position of the magnetic domain wall 9 as described above, and therefore one issue in the data writing is the control of the position of the magnetic domain wall 9. In this embodiment, the data writing is achieved in two steps.

First, as shown in FIG. 6A, the magnetic domain wall 9 is moved to a position between the reference layer 43 and the magnetization fixed region 2b to achieve initialization. This state corresponds to the state in which the memory cell 10 stores data "00". Specifically, the NMOS transistors 51 and 52 are placed into the ON state and a write current IW0 is flown from the magnetization fixed layer 12 to the magnetization fixed layer 11. As is understood from FIG. 6A, the magnetization domain wall 9 can be initialized to a position between the reference layer 43 and the magnetization fixed region 2b by appropriately controlling the current level of the write current IW0 and the length of time T0 during which the write current IW0 is flown, regardless of which of data "00", "01", "10" and "11" are stored in the memory cell 10 before the data writing.

This is followed by moving the magnetic domain wall 9 to a desired position by flowing a write current from the magnetization fixed layer 11 to the magnetization fixed layer 12 to write desired data. It should be noted that it is unnecessary to flow a write current for writing data "00"; the memory cell 10 is placed in the state in which data "00" are stored after the initialization.

In detail, for writing data "01", the magnetic domain wall 9 is moved to a position between the references 42 and 43 by flowing a write current IW1 from the magnetization fixed layer 11 to the magnetization fixed layer 12. It should be noted that the moving distance of the magnetic domain wall 9 depends on the current level of the write current IW1 and the length of time T1 during which the write current IW1 is flown. It is possible to move the magnetic domain wall 9 to a position between the reference layers 42 and 43 by appropriately controlling the current level of the write current IW1 and the length of time T1 during which the write current IW1 is flown.

For writing data "10", a write current IW2 is flown from the magnetization fixed layer 11 to the magnetization fixed layer 12 and the magnetic domain wall 9 is thereby moved to a position between the reference layers 41 and 42. Also in this case, it is possible to move the magnetic domain wall 9 to a position between the reference layers 41 and 42 by appropriately controlling the current level of the write current IW2 and the length of time T2 during which the write current IW2 is flown.

For writing data "11", a write current IW3 is flown from the magnetization fixed layer 11 to the magnetization fixed layer 12 and the magnetic domain wall 9 is thereby moved to a position between the magnetization fixed region 2a and the reference layer 41. Also in this case, it is possible to move the magnetic domain wall 9 to a position between the magnetization fixed region 2a and the reference layer 41 by appropriately controlling the current level of the write current IW3 and the length of time T3 during which the write current IW3 is flown.

Since the moving distance of the magnetic domain wall 9 is schematically proportional to the current level of the write current and the length of time during which the write current is flown, the following expression holds:

$$IW0 \cdot T0 > IW3 \cdot T3 > IW2 \cdot T2 > IW1 \cdot T1.$$

For the case when the lengths of times during which the write currents IW0, IW1, IW2 and IW3 are flown are same, the following expression holds:

$$IW0 > IW3 > IW2 > IW1.$$

The control of the position of the magnetic domain wall 9 may be achieved by controlling the current level of the write current, or by controlling the length of time during which the write current is flown. The control of the position of the magnetic domain wall 9 may be achieved by controlling both of the current level of the write current and the length of time during which the write current is flown.

Figure 7:
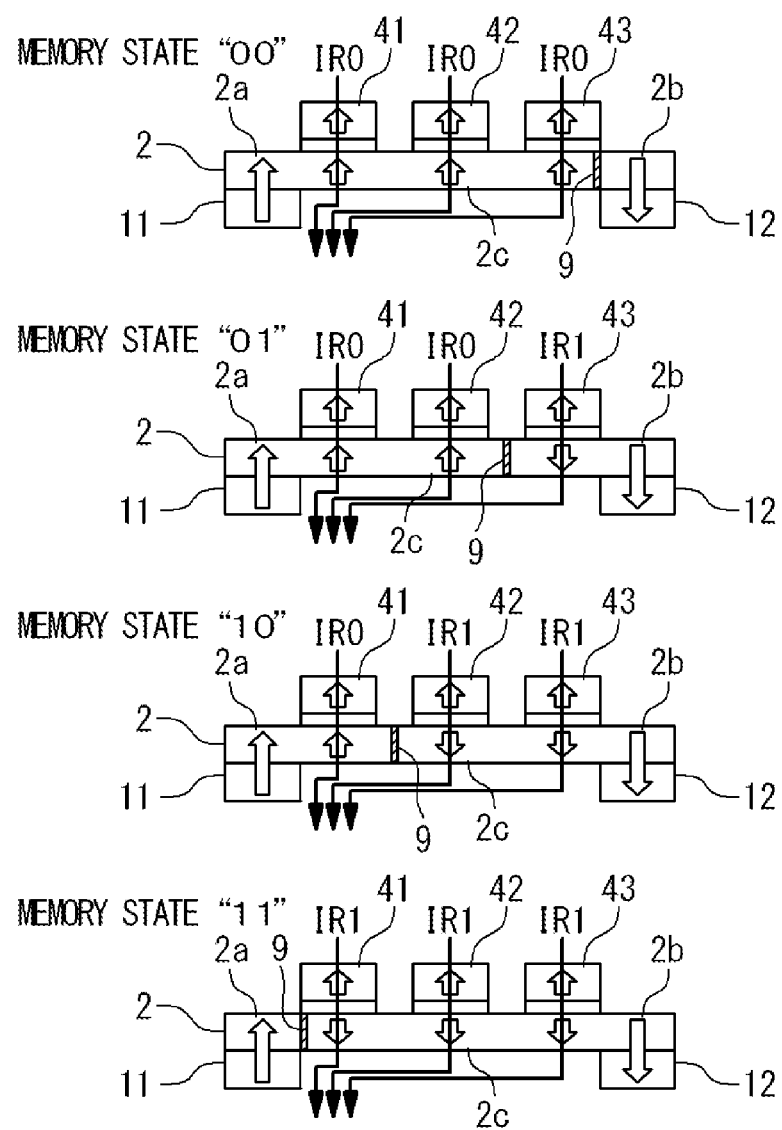
FIG. 7 is a diagram showing an exemplary data read operation in the first embodiment.

FIG. 7 is a diagram showing the read operation of the memory cell 10 in this embodiment. The magnetization directions of the memory cell 10 in the respective memory states are as shown in FIGS. 5A to 5D. In the read operation, read currents are flown through the three MTJs formed on the magnetization reversible region 2c and the read currents are detected. For example, the read currents can be flown through the three MTJs by applying voltages between the read bitlines RBL1, RBL2, RBL3 and the write bitline BL1 with the NMOS transistor 51 turned on. Here, the NMOS transistor 52 may be set to the OFF state, if the NMOS transistors 51 and 52 can be individually controlled. When the memory cell 10 is configured so that the NMOS transistors 51 and 52 are turned on and off at the same time, the write bitlines BL1 and BL2 are set to the same voltage level (most easily, connected to the grounding line GND), with the NMOS transistors 51 and 52 turned on. In the following, a description is given of the read operation for the respective states of the memory cell 10, referring the read current for the low-resistance state of the MTJ to as read current IR0 and the read current for the high-resistance state of the MTJ to as read current IR1.

In the event when the memory cell 10 stores data "00", all of the three MTJs are placed in the low-resistance state. Accordingly, read currents IR0 corresponding to the low-resistance state are flown through the reference layers 41 to 43 when voltages are applied between the read bitlines RBL1, RBL2, RBL3 and the write bitline BL1. In other words, the currents flown through the read bitlines RBL1, RBL2 and RBL3 are each identical to the read current IR0. Data "00" can be reproduced by detecting the currents flown through the read bitlines RBL1, RBL2 and RBL3 and encoding the detected currents into two-bit data with an encode circuit.

In the event when the memory cell 10 stores data "00", the MTJ formed by the reference layer 41, the tunnel barrier film 31 and the magnetization reversible region 2c and the MTJ formed by the reference layer 42, the tunnel barrier film 33 and the magnetization reversible region 2c are placed in the low-resistance state, while the MTJ formed by the reference layer 43 the tunnel barrier film 33 and the magnetization reversible region 2c is placed in the high-resistance state. Accordingly, when voltages are applied between the read bitlines RBL1, RBL2, RBL3 and the write bitline BL1, read currents IR0 corresponding to the low-resistance state flow through the reference layers 41 and 42 and a read current IR1 corresponding to the high-resistance state flows through the reference layer 43. In other words, the read currents flown through the read bitlines RBL1, RBL2 and RBL3 are identical to read currents IR0, IR0 and IR1, respectively. Data "01" can be reproduced by detecting the currents flown through the read bitlines RBL1, RBL2 and RBL3 with the sense amplifier and encoding the detected currents into two-bit data with the encode circuit.

For the cases when the memory cells 10 stores data "10" and "11", the data stored in the memory cell 10 can be read in the same way.

Figure 8:
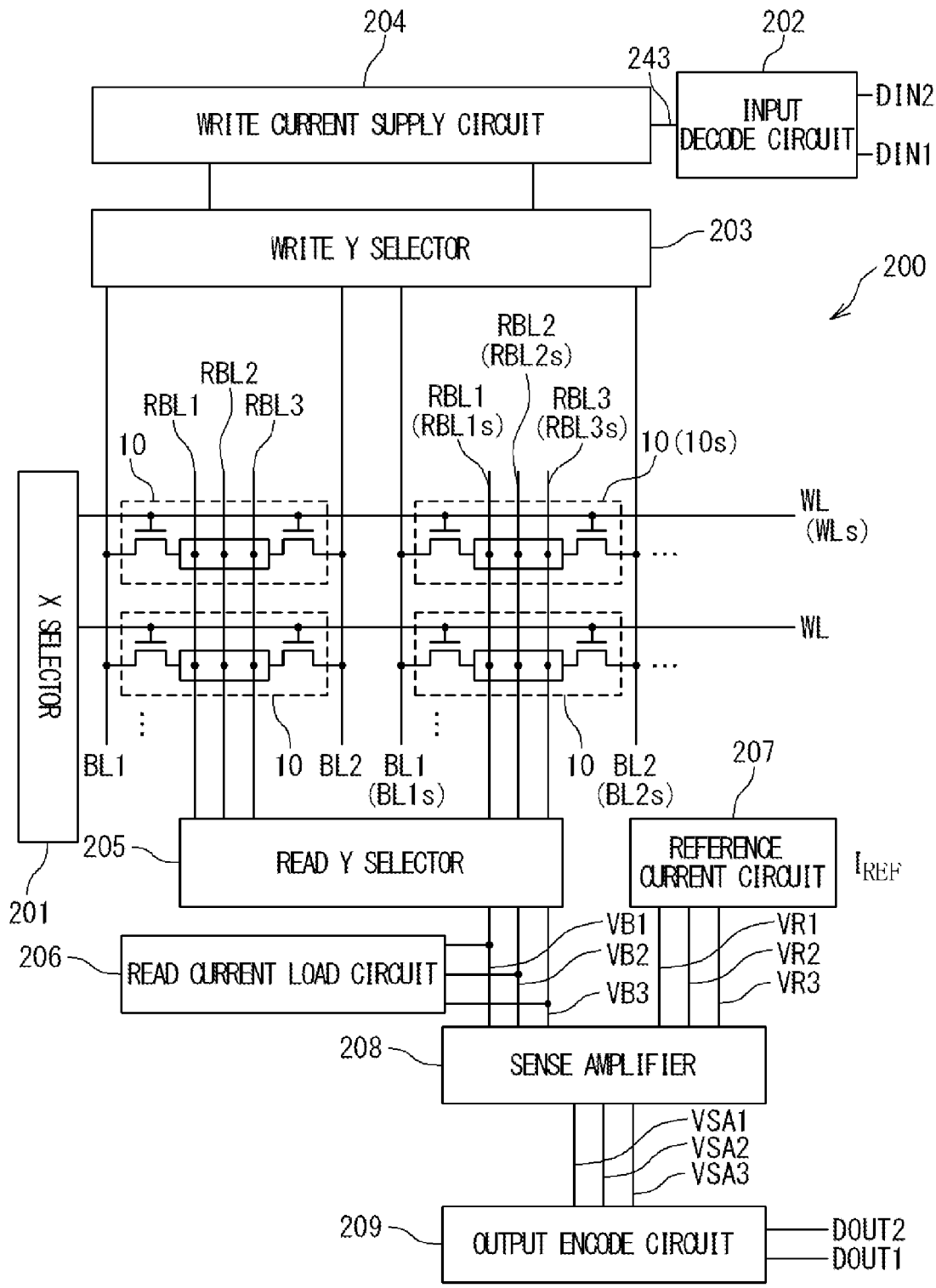
FIG. 8 is a block diagram showing an exemplary configuration of a magnetic random access memory in the first embodiment.

FIG. 8 is a block diagram showing one example of the configuration of an MRAM 200 which incorporates the memory cells 10 of the first embodiment. The MRAM 200 of the first embodiment includes a memory cell array in which a plurality of memory cells 10 structured as described above are arranged in rows and columns. The memory cell array further includes word liens WL, write bitlines BL1, BL2, and read bitlines RBL1, RBL2 and RBL3.

The MRAM 200 further includes an X selector 201, an input decode circuit 202, a write Y selector 203, a write current supply circuit 204, a read Y selector 205, a read current load circuit 206, a reference current circuit 207, a sense amplifier 208 and an output encode circuit 209. The X selector 201 is connected to the word lines WL and selects the word line WL connected to the selected memory cell (the memory cell 10 to be accessed) as a selected word line, in data writing and reading. In FIG. 8, the selected memory cell is denoted by the numeral 10s and the selected word line is denoted by the numeral WLs.

The write Y selector 203 is connected to the write bitlines BL1 and BL2 and selects the write bitlines BL1 and BL2 connected to the selected memory cell 10s as the selected write bitlines BL1s and BL2s. The write current supply circuit 204 feeds a write current IW0 used for the initialization of the selected memory cell 10s and a write current (IW1, IW2 or IW3) corresponding to data to be written to the selected write bitlines BL1s and BL2s. The input decode circuit 202 decodes data inputted to the inputs DIN1 and DIN2, and generates an input decode signal 243 which sets the write current (IW0, IW1, IW2 or IW3) to be generated by the write current supply circuit 204.

Figure 9:
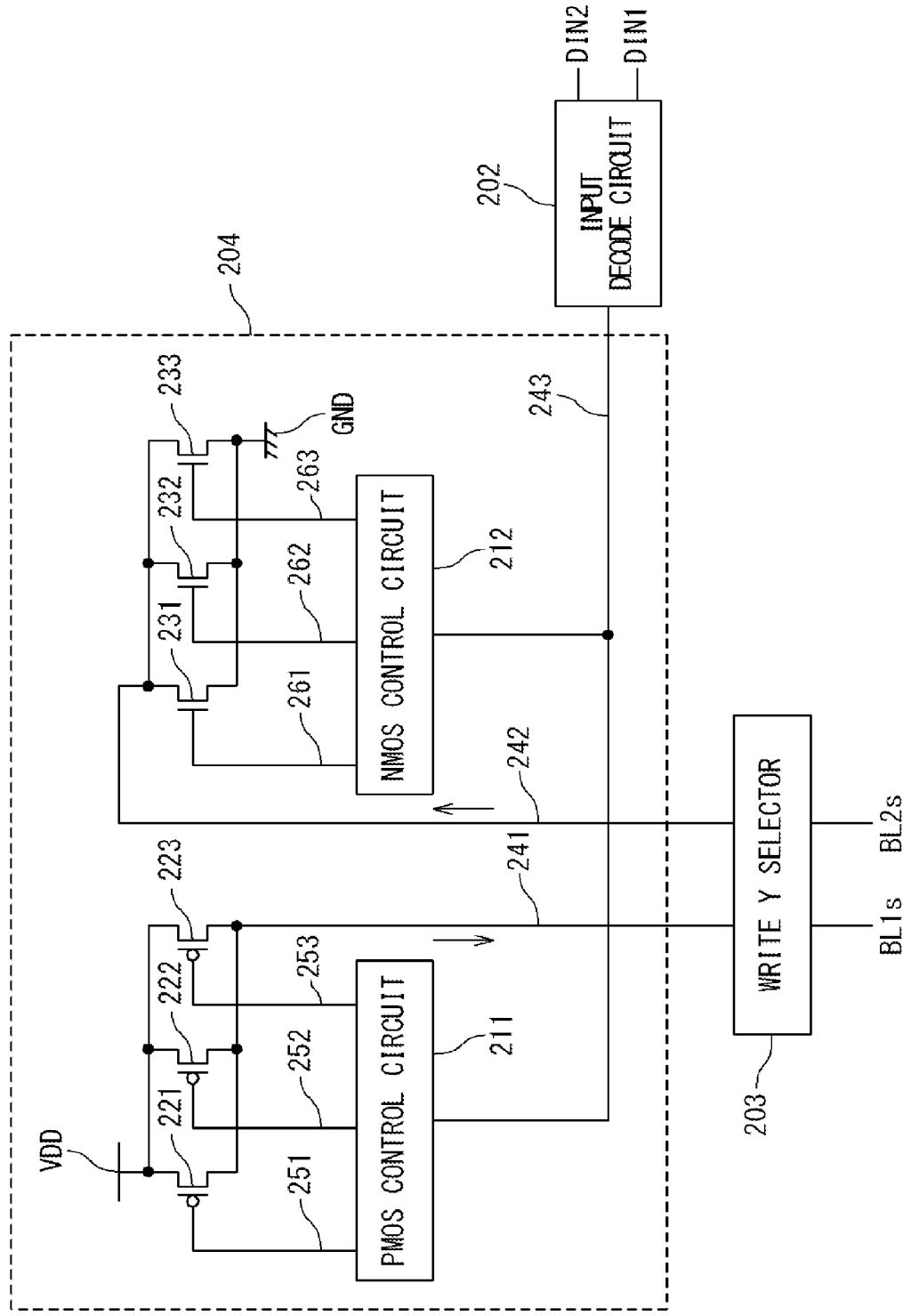
FIG. 9 is a circuit diagram showing an example of the configuration of a write current supply circuit.

FIG. 9 shows a specific example of the configuration of the write current supply circuit 204. The write current supply circuit 204 includes a set of parallel-connected PMOS transistors 221, 222 and 223 and a set of parallel-connected NMOS transistors 231, 232 and 233, a PMOS control circuit 211 and an NMOS control circuit 212. The input decode signal 243 fed to the write current supply circuit 204 from the input decode circuit 202 is supplied to the PMOS control circuit 211 and the NMOS control circuit 212. The PMOS control circuit 211 outputs PMOS control signals 251, 252 and 253 which control the PMOS transistors 211, 222 and 223, respectively, in response to the input decode signal 243. Correspondingly, the NMOS control circuit 212 outputs NMOS control signals 261, 262 and 263 which control the PMOS transistors 231, 232 and 233, respectively, in response to the input decode signal 243. The PMOS transistors 221, 222 and 223 have sources commonly connected to the power supply VDD, and drains commonly connected to the write current output line 241. The write current output line 241 is connected to the write Y selector 203. The NMOS transistors 231, 232 and 233, on the other hand, have sources commonly connected to the grounding line GND and drains commonly connected to a write current drawing line 242. The write current drawing line 242 is connected to the write Y selector 203.

The write current supply circuit 204 shown in FIG. 9 operates to supply a write current of a desired current level to the selected memory cell 10s as follows: The write Y selector 203 connects one of the selected write bitlines BL1 and BL2 to the write current output line 241 and the other to the write current drawing line 242, in accordance with the direction of the write current to be flown through the selected memory cell 10s. In addition, an appropriate number of transistors selected from the PMOS transistors 221, 222, 223 and NMOS transistors 231, 232 and 233, are turned on depending on the current level of the write current to be flown, in response to the PMOS control signals 251, 252, 253 and the NMOS control signals 261, 262 and 263. This allows controlling the write current to the current level of any one of the above-described write currents IW0, IW1, IW2 and IW3. The write current is fed to the selected memory cell 10s from the power supply VDD via the write current output line 241 and the selected write bitline connected thereto (BL1s or BL2s) and flown into the grounding line GND via the write current drawing line 242 after passing through the selected memory cell 10s.

Referring back to FIG. 8, the read Y selector 205 is connected to the read bitlines RBL1, RBL2 and RBL3. The read Y selector 205 selects the read bitlines RBL1, RBL2 and RBL3 connected to the selected memory cell 10s as the selected read bitlines RBL1s, RBL2s and RBL3s. The read current load circuit 206 receives read currents flown through the selected read bitlines RBL1s, RBL2s and RBL3s and converts the respective read currents into read voltages VB1, VB2 and VB3, respectively, by individually integrating the read currents. The reference current circuit 207, on the other hand, generates a read reference current $I_{REF}$ and generates read reference voltages VR1, VR2 and VR3 by integrating the read reference current $I_{REF}$. It should be noted that the read reference voltages VR1, VR2 and VR3 are generated from the same read reference current $I_{REF}$. The read reference current $I_{REF}$ may be generated by a constant current circuit or reference cells of the same structure as the memory cells. The sense amplifier 208 compares the read voltages VB1, VB2 and VB3 with the read reference voltages VR1, VR2 and VR3, respectively, and generates identification data VSA1, VSA2 and VSA3 corresponding to the comparison results. Here, the identification data VSA1 corresponds to the comparison result of the read voltage VB1 and the read reference voltage VR1. Correspondingly, the identification data VSA2 corresponds to the comparison result of the read voltage VB2 and the read reference voltage VR2, and the identification data VSA3 corresponds to the comparison result of the read voltage VB3 and the read reference voltage VR3. The identification data VSA1, VSA2 and VSA3 are outputted to the output encode circuit 209. The output encode circuit 209 encodes the identification data VSA1, VSA2 and VSA3 sensed by the sense amplifier 08 into two-bit data and outputs the two-bit data to the outputs DOUT1 and DOUT2.

Figure 10A:
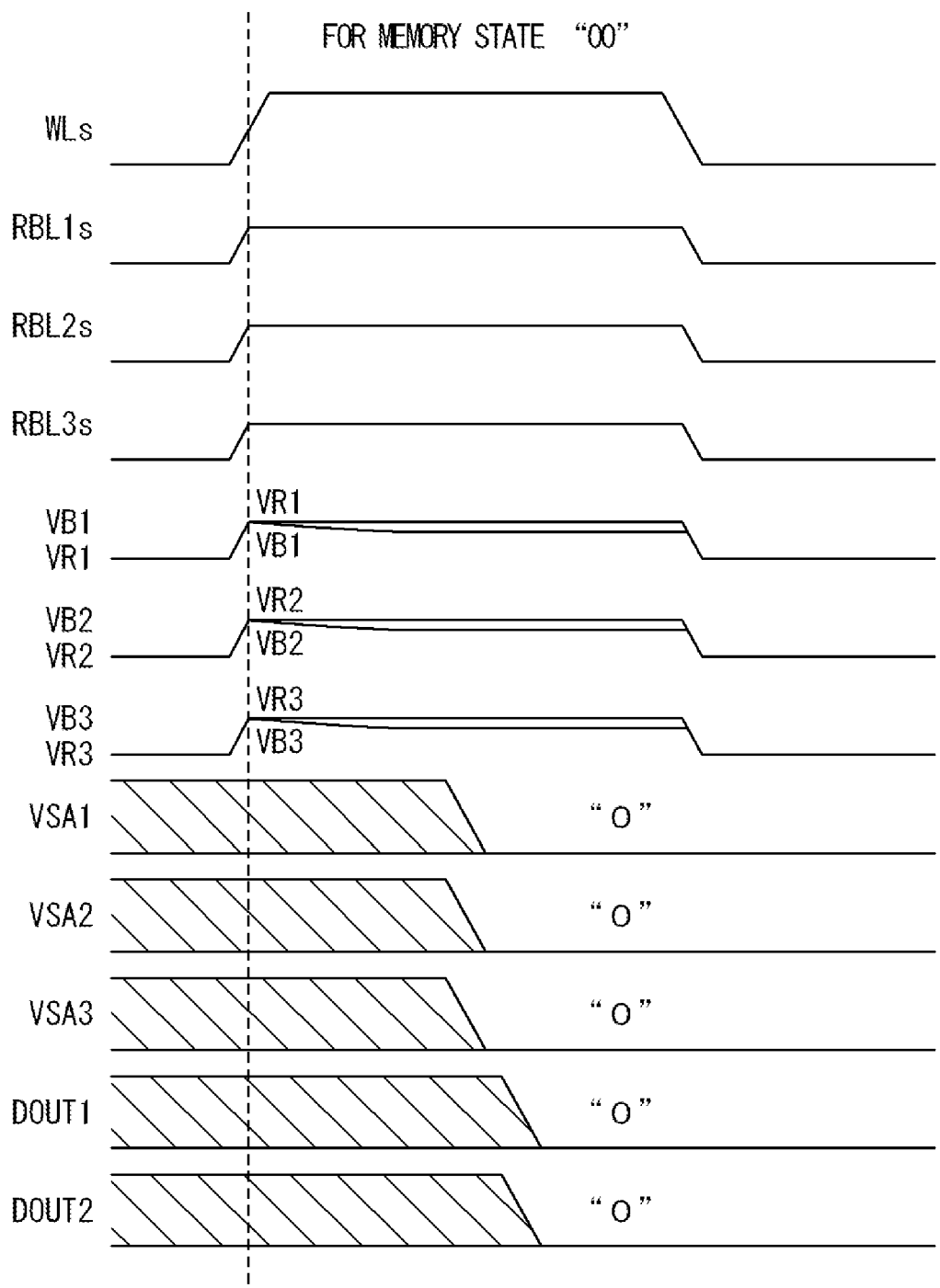
FIG. 10A is a timing chart showing an exemplary read operation from a selected memory cell storing data "00" in the first embodiment.
Figure 10B:
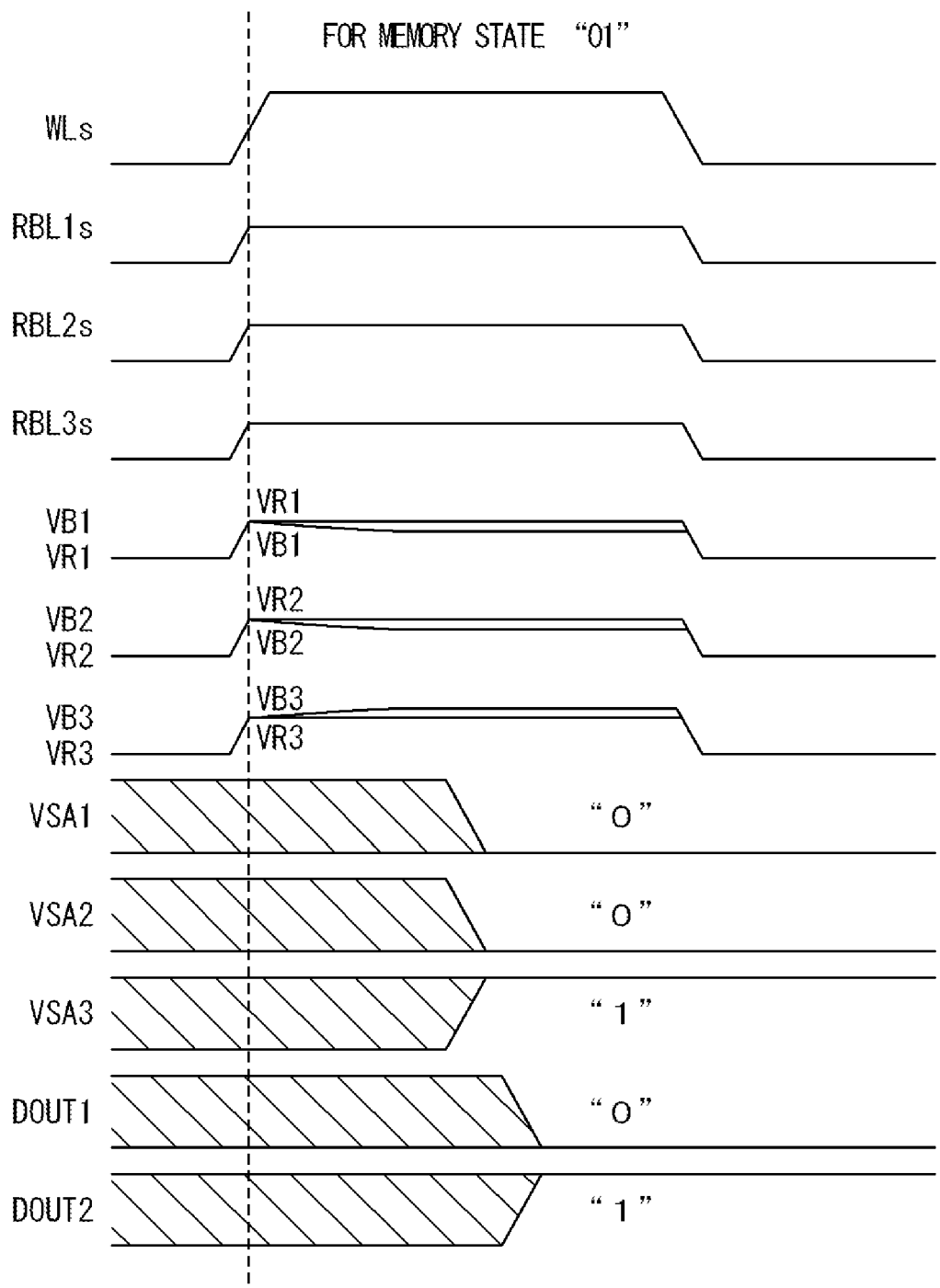
FIG. 10B is a timing chart showing an exemplary read operation from a selected memory cell storing data "01" in the first embodiment.
Figure 10C:
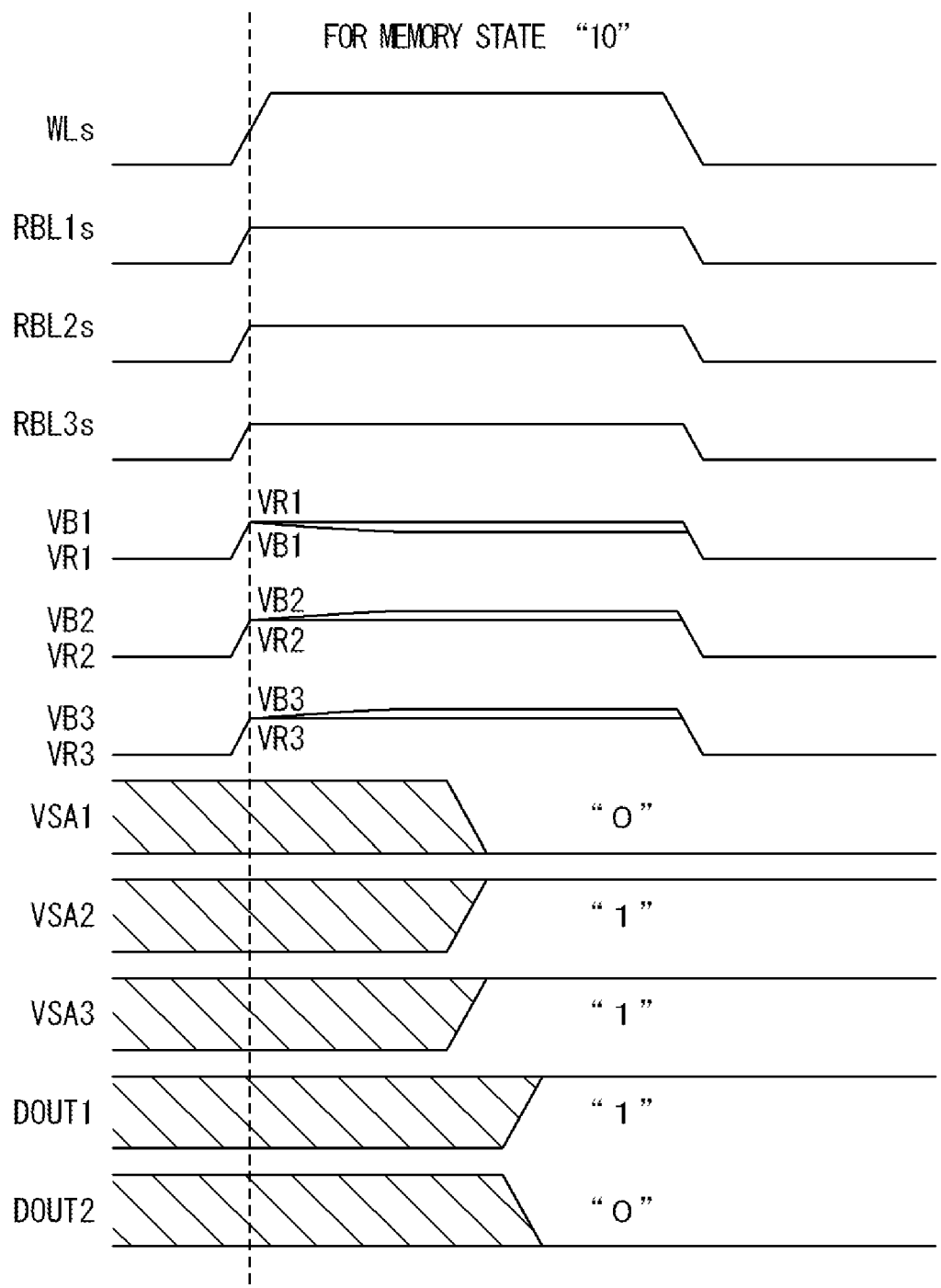
FIG. 10C is a timing chart showing an exemplary read operation from a selected memory cell storing data "10" in the first embodiment.
Figure 10D:
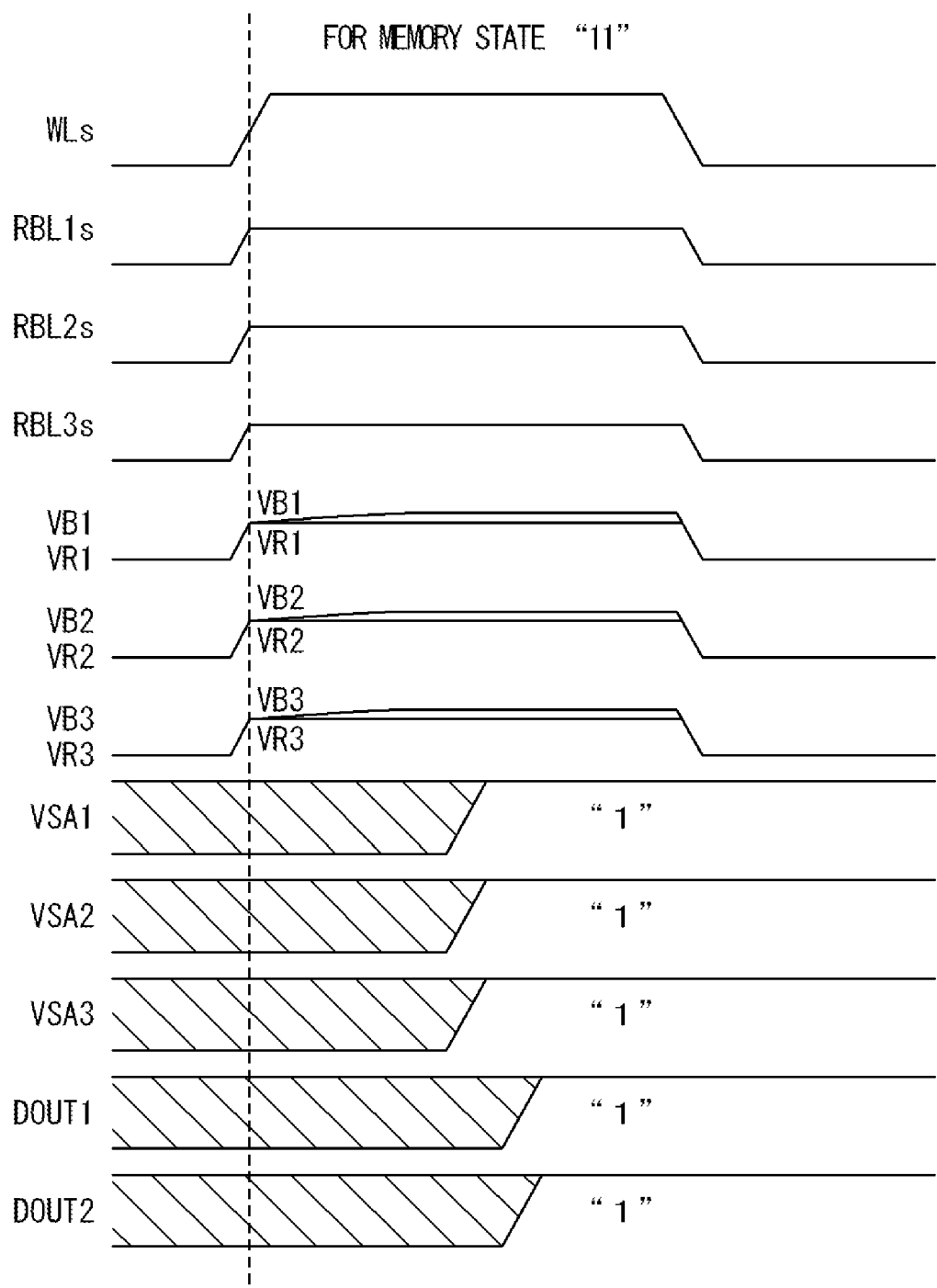
FIG. 10D is a timing chart showing an exemplary read operation from a selected memory cell storing data "11" in the first embodiment.

FIGS. 10A to 10D are timing charts showing the read operation of the MRAM configured as shown in FIG. 8. FIG. 10A shows the operation in the case when data "00" are stored in the selected memory cell 10s, and FIG. 10B shows that in the case when data "01" are stored in the selected memory cell 10s. Correspondingly, FIG. 10C shows the operation in the case when data "10" are stored in the selected memory cell 10s, and FIG. 10D shows that in the case when data "11" are stored in the selected memory cell 10s.

The read operation is achieved by setting the selected word line WLs to a high level, and setting the selected read bitlines RBL1s, RBL2s and RBL3s to a predetermined read voltage level $V_{READ}$. This results in that the read voltages VB1, VB2 and VB3, which correspond to the read currents flowing through the three MTJs of the selected memory cell 10s, are generated on the inputs of the sense amplifier 208. The sense amplifier 208 compares the read voltages VB1, VB2 and VB3 with the read reference voltages VR1, VR2 and VR3 generated by the reference current circuit 207.

When data "00" are stored in the selected memory cell 10s, as shown in FIG. 10A, the read voltage VB1, VB2 and VB3 are lower than the read reference voltages VR1, VR2 and VR3, respectively. This results in that all of the identification data VSA1, VSA2 and VSA3 are set to data "0". The output encode circuit 209 identifies the states of the three MTJs of the selected memory cell 10s from the identification data VSA1, VSA2 and VSA3, and sets both of the outputs DOUT1 and DOUT2 to data "0". In other words, the output encode circuit 209 identifies the data stored in the selected memory cell 10s as data "00".

When data "01" are stored in the selected memory cell 10s, as shown in FIG. 10B, the read voltages VB1 and VB2 are lower than the read reference voltages VR1 and VR2, respectively, and the read voltage VB3 is higher than the read reference voltage VR3. This results in that the identification data VSA1 and VSA2 are both set to data "0" and the identification data VSA3 are set to data "1". The output encode circuit 209 identifies the states of the three MTJs of the selected memory cell 10s from the identification data VSA1, VSA2 and VSA3, and sets the outputs DOUT1 and DOUT2 to data "0" and "1", respectively. In other words, the output encode circuit 209 identifies the data stored in the selected memory cell 10s as data "01".

The same goes for the case when data "10" are stored in the selected memory cell 10s (See FIG. 10C) or when data "11" are stored (See FIG. 10D). Identification data VSA1, VSA2 and VSA3 are generated which correspond to the comparison results of the read voltages VB1, VB2 and VB3 with the read reference voltages VR1, VR2 and VR3, and data "10" or "11" are outputted from the data output DOUT1 and DOUT2 by encoding the identification data VSA1, VSA2 and VSA3.

As thus described, the memory cell 10 of the MRAM 200 of the first embodiment, in which the read bitlines RBL1, RBL2 and RBL3 are individually disposed, is suitable for the high-speed read operation, while effectively reducing the area necessary for storing one bit. This effectively reduces the cost of the MRAM 200.

Second Embodiment

Figure 11:
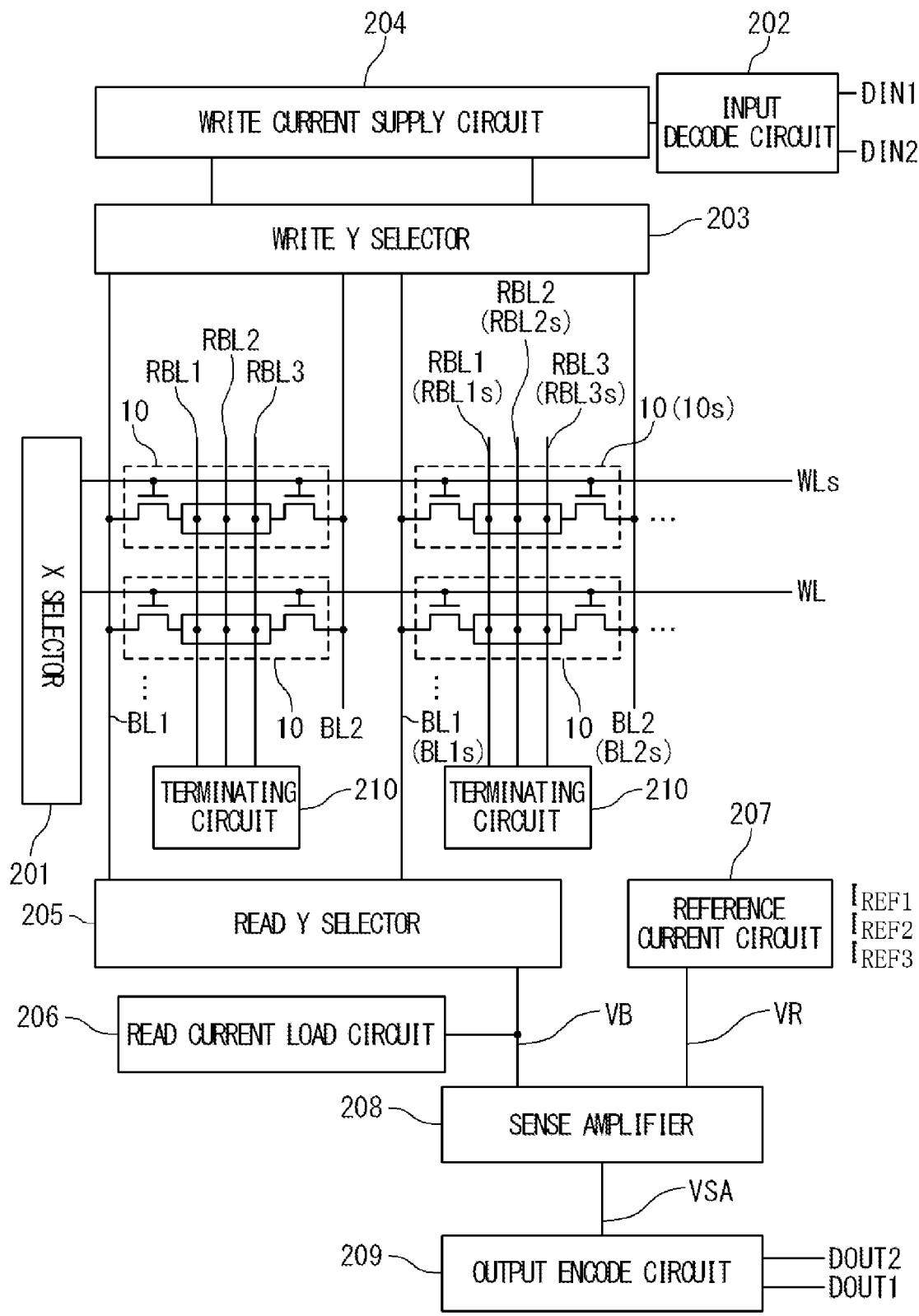
FIG. 11 is a block diagram showing an exemplary configuration of a magnetic random access memory in a second embodiment.

FIG. 11 is a block diagram showing an exemplary configuration of an MRAM 200A of a second embodiment. In the above-described configuration shown in FIG. 8, the read voltages VB1, VB2 and VB3 are generated from the read currents flown through the read bitlines RBL1, RBL2 and RBL3, respectively and the data identification is achieved by comparing the read voltages VB1, VB2 and VB3 with the read reference voltages VR1, VR2 and VR3, respectively. It should be noted that the currents flowing through the three MTJs of the selected memory cells 10s also passes through the write bitline BL1, as is understood from FIG. 7. This implies that data stored in the selected memory cell 10s can be identified by detecting the current flowing through the write bitline BL1. FIG. 11 shows an exemplary configuration in which data stored in the selected memory cell 10s are identified by detecting the current flowing through the write bitline BL1.

In the MRAM 200A of the second embodiment, the read bitlines RBL1, RBL2 and RBL3 are connected to terminating circuits 210 and the write bitlines BL1 are connected to the read Y selector 205. A selected terminating circuit 210 connected to the selected read bitlines RBL1s, RBL2s and RBL3s, which is selected from the terminating circuits 210, sets the selected read bitlines RBL1s, RBL2s and RBL3s to a predetermined voltage level $V_{READ}$. The read current load circuit 206 receives the current flown from the selected read bitlines BRL1s, RBL2s and RBL3s to the write bitline BL1 and converts the received current into a read voltage VB by integrating the received current.

The reference current circuit 207 generates a read reference current and generates a read reference voltage VR by integrating the read reference current. In this embodiment, the reference current circuit 207 is configured to control the current level of the generated read reference current. The reference current circuit 207 selects the current level from among $I_{REF1}$, $I_{REF2}$ and $I_{REF3}$ and generates the read reference current to have the selected current level. It should be noted that it holds:

$$I_{REF1} < I_{REF2} < I_{REF3}.$$

The read reference voltage VR generated by the reference current circuit 207 is controllable in response to the current level of the read reference current.

The sense amplifier 208 compares the read voltage VB with the read reference voltage VR and generates identification data VSA in accordance with the comparison result. As described later, the identification data VSA may vary in the time domain, since the read reference voltage VR varies during the read operation. The output encode circuit 209 identifies data stored in the selected memory cell 10s from the values of the identification data VSA at different timings during the read operation, and outputs the identification data from the outputs DOUT1 and DOUT2.

Figure 12C:
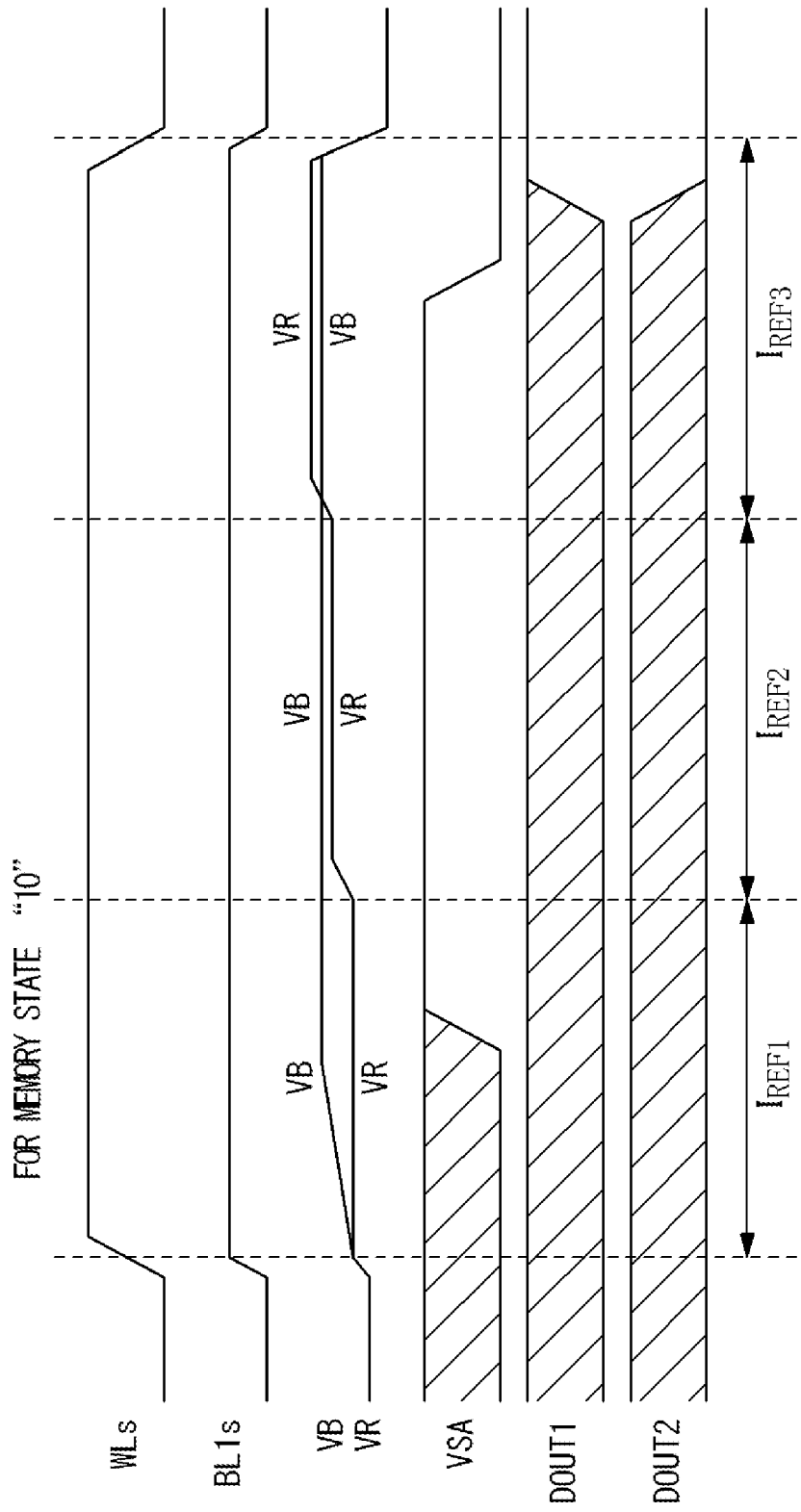
FIG. 12C is a timing chart showing an exemplary read operation from a selected memory cell storing data "10" in the first embodiment.
Figure 12D:
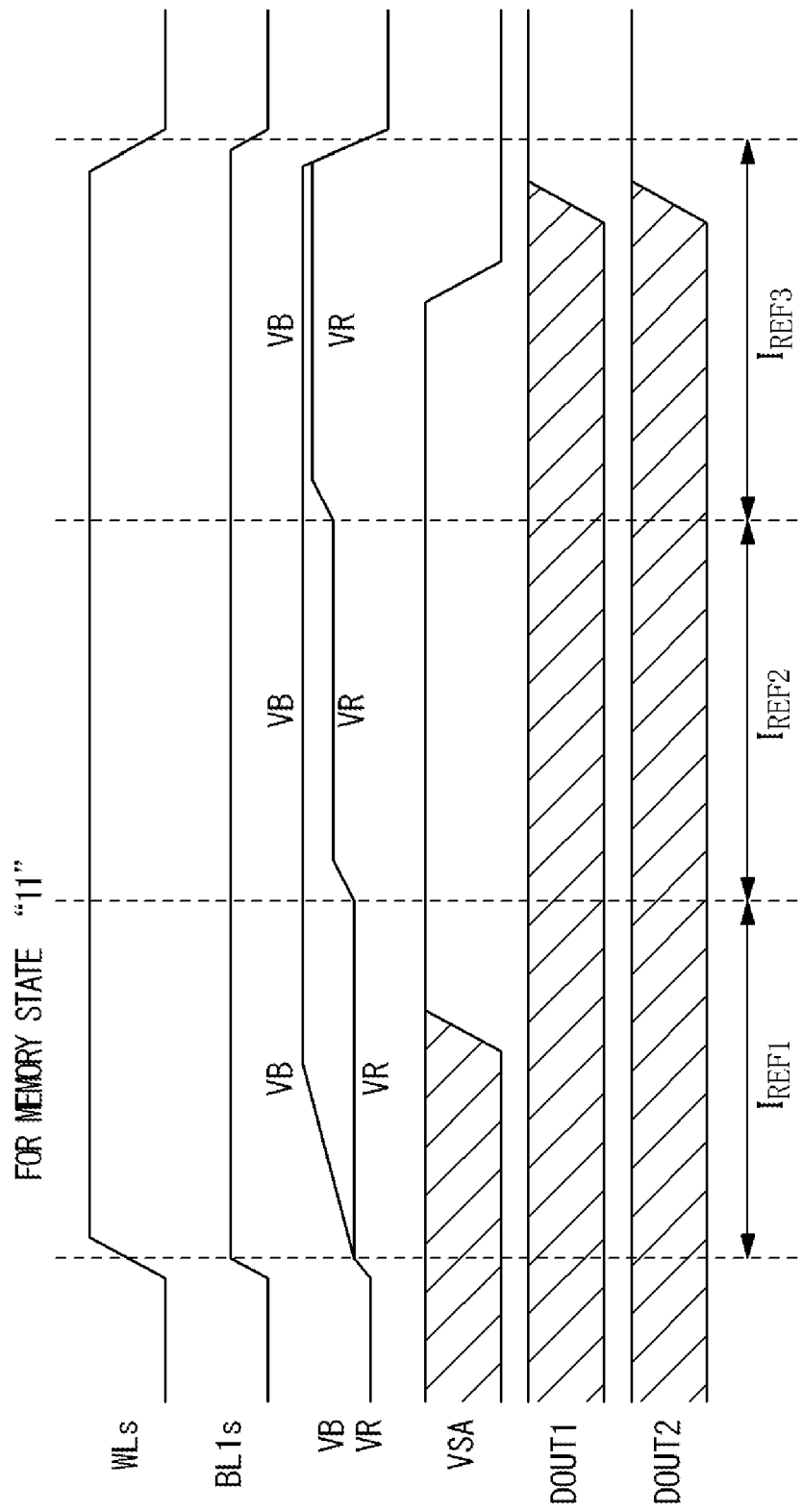
FIG. 12D is a timing chart showing an exemplary read operation from a selected memory cell storing data "11" in the first embodiment.

FIGS. 12A to 12D are timing charts showing the read operation of the MRAM shown in FIG. 11. FIG. 12A shows the operation for the case when data "00" are stored in the selected memory cell 10s, and FIG. 12B shows the operation for the case when data "01" are stored in the selected memory cell 10s. Correspondingly, FIG. 12C shows the operation for the case when data "10" are stored in the selected memory cell 10s, and FIG. 12D shows the operation for the case when data "11" are stored in the selected memory cell 10s.

In the read operation, as shown in FIGS. 12A to 12D, the reference current circuit 207 sets the read reference current to the current level $I_{REF1}$ during a first period, and then sets the read reference current to the current level $I_{REF2}$ during a second period which follows the first period. The reference current circuit 207 finally sets the read reference current to the current level $I_{REF3}$ during a third period which follows the second period. The read reference voltage VR also varies in accordance with the variations in the read reference current. The sense amplifier 208 compares the read voltage VB with the read reference voltage VR in each of the first to third periods. The output encode circuit 209 encodes the values of the identification data VSA in the first to third periods and outputs the value obtained by the encoding from the outputs DOUT1 and DOUT2.

When data "00" are stored in the selected memory cell 10s, the read voltage VB is lower than the read reference voltage VR in all of the first to third periods, as shown in FIG. 12A. This results in that the value of the identification data VSA is data "0" in all of the first to third periods. The output encode circuit 209 identifies the states of the three MTJs of the selected memory cell 10s from the identification data VSA and sets both of the outputs DOUT1 and DOUT2 to data "0". In other words, the output encode circuit 209 identifies data stored in the selected memory cell 10s as data "00".

When data "01" are stored in the selected memory cell 10s, as shown in FIG. 12B, the read voltage VB is higher than the read reference voltage VR in the first period, and the read voltage VB is lower than the read reference voltage VR in the second and third periods. This results in that the value of the identification data VSA is set to data "1" in the first period, and then set to data "0" in the second and third periods. The output encode circuit 209 identifies the states of the three MTJs of the selected memory cell 10s from the identification data VSA, and sets the outputs DOUT1 and DOUT2 to data "0" and "1", respectively. In other words, the output encode circuit 209 identifies data stored in the selected memory cell 10s as data "01".

The same goes for the case when data "10" are stored in the selected memory cell 10s (See FIG. 12C) and the case when data "11" are stored in the selected memory cell 10s (See FIG. 12D); data "10" or "11" are outputted from the data outputs DOUT1 and DOUT2 by encoding the identification data VSA which corresponds to the comparison results of the read voltage VB with the read reference voltage VR in the first to third periods.

It should noted that, although the previously-given description of the read operation recites that the read currents flowing through the three MTJs of the selected memory cell 10s are flown through the selected write bitline BL1s, the read currents may be flown through the selected write bitline BL2s in place of the selected write bitline BL1s. In this case, the write bitlines BL2 are connected to the read Y selector 205 in place of the write bitlines BL1.

Third Embodiment

Figure 13:
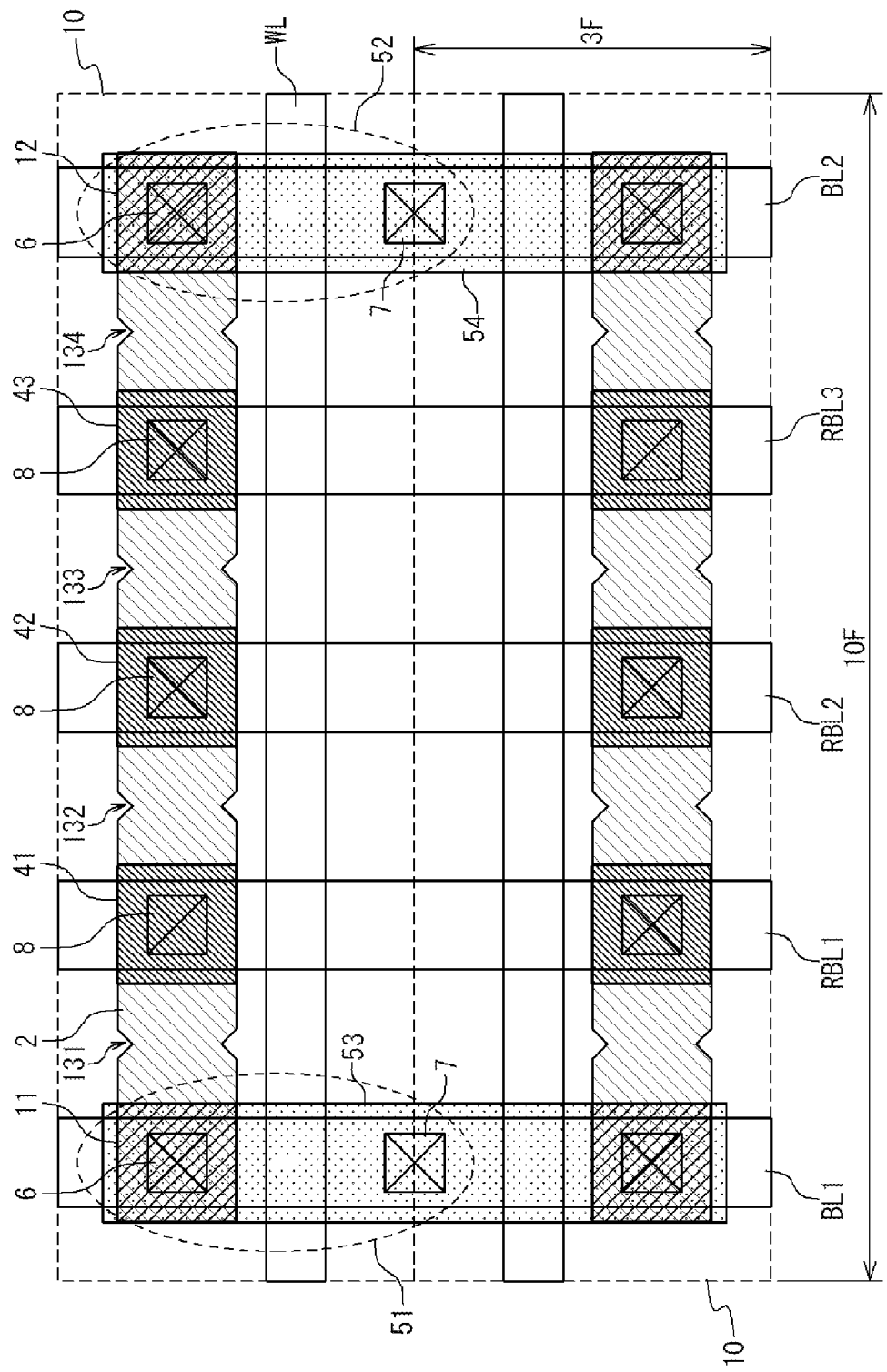
FIG. 13 is a diagram showing an exemplary layout of a memory cell of a magnetic random access memory in a third embodiment.

FIG. 13 is a layout diagram showing the layout of memory cells of an MRAM of a third embodiment. In the third embodiment, the magnetic recording layer 2 has notches 131 to 134. The notch 131 is positioned between the magnetization fixed layer 11 and the reference layer 41, and the notch 132 is positioned between the reference layers 41 and 42. Furthermore, the notch 133 is positioned between the reference layers 42 and 43 and the notch 133 is positioned between the reference layers 43 and the magnetization fixed layer 12.

The notches 131, 132, 133 and 134 function as pin potentials for the magnetic domain wall 9. This makes it easy to control the position of the magnetic domain wall 9 and improves the reliability of the data writing.

Fourth Embodiment

Figure 14:
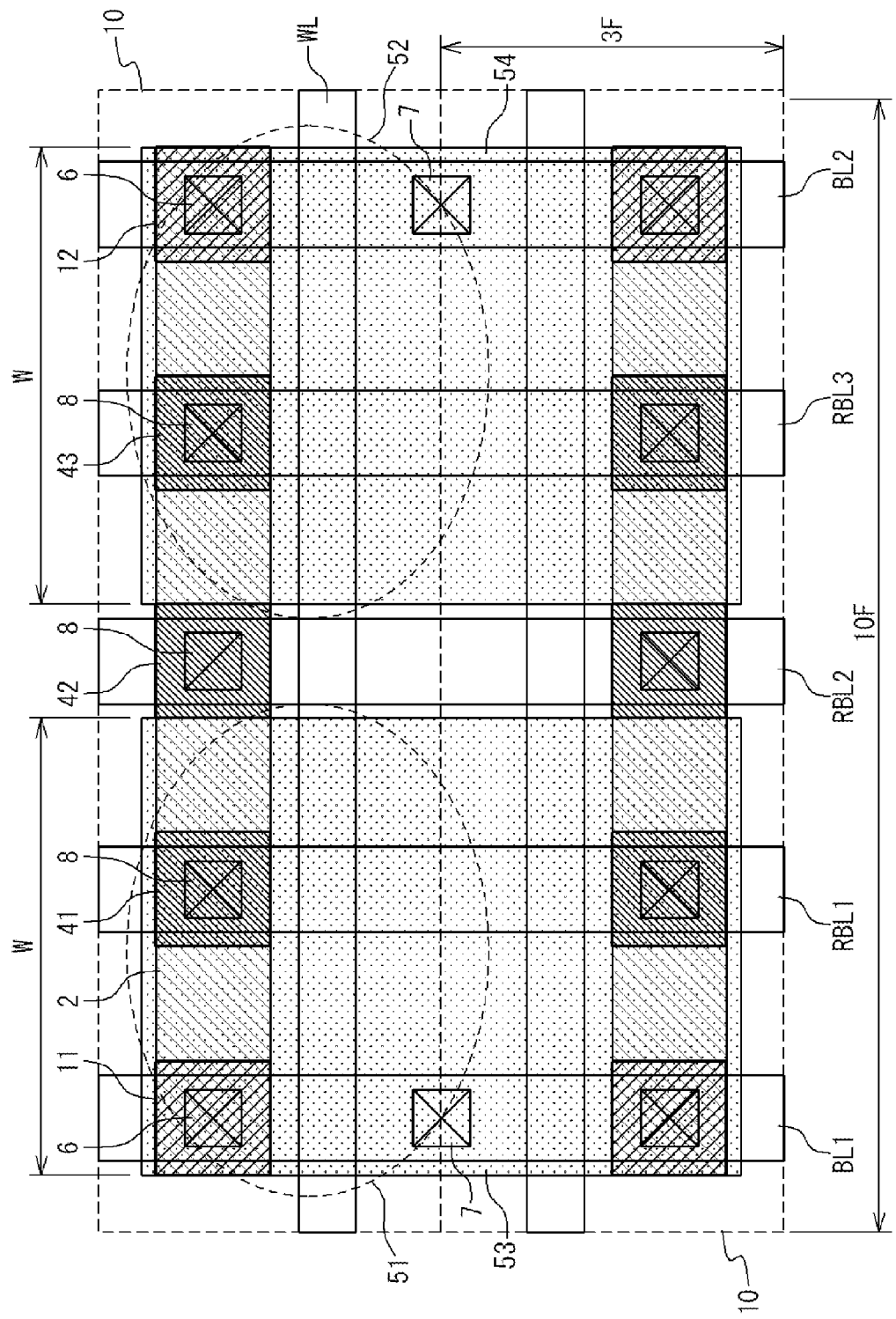
FIG. 14 is a diagram showing an exemplary layout of a memory cell of a magnetic random access memory in a fourth embodiment.

FIG. 14 is a layout diagram showing an exemplary layout of memory cells of an MRAM of a fourth embodiment. In the layout of the fourth embodiment shown in FIG. 14, the width W of the diffusion layers 53 and 54 are increased, compared to the layout shown in FIG. 4. More specifically, the diffusion layer 53 is disposed so as to at least reach the region under the read bitline RBL1 from the via-contact 7 which connects the write bitline BL1 and the diffusion layer 53, and the diffusion layer 54 is disposed so as to at least reach the region under the read bitline RBL3 from the via-contact 7 which connects the write bitline BL2 and the diffusion layer 54. In the layout shown in FIG. 14, the diffusion layer 53 is disposed to reach the region between the read bitlines RBL1 and RBL2 and the diffusion layer 54 is disposed to reach the region between the read bitlines RBL2 and RBL3.

The increase in the channel widths (gate widths) of the NMOS transistors 51 and 52 enables flowing a large write current, and effectively reduces the length of time necessary for completing the data write. In order to flow a large write current, it is preferable that the spacing between the diffusion layers 53 and 54 are adjusted to the minimum dimension allowed in the design rules used for manufacturing the MRAM. This allows maximizing the channel widths of the NMOS transistors 51 and 52.

Fifth Embodiment

Figure 15:
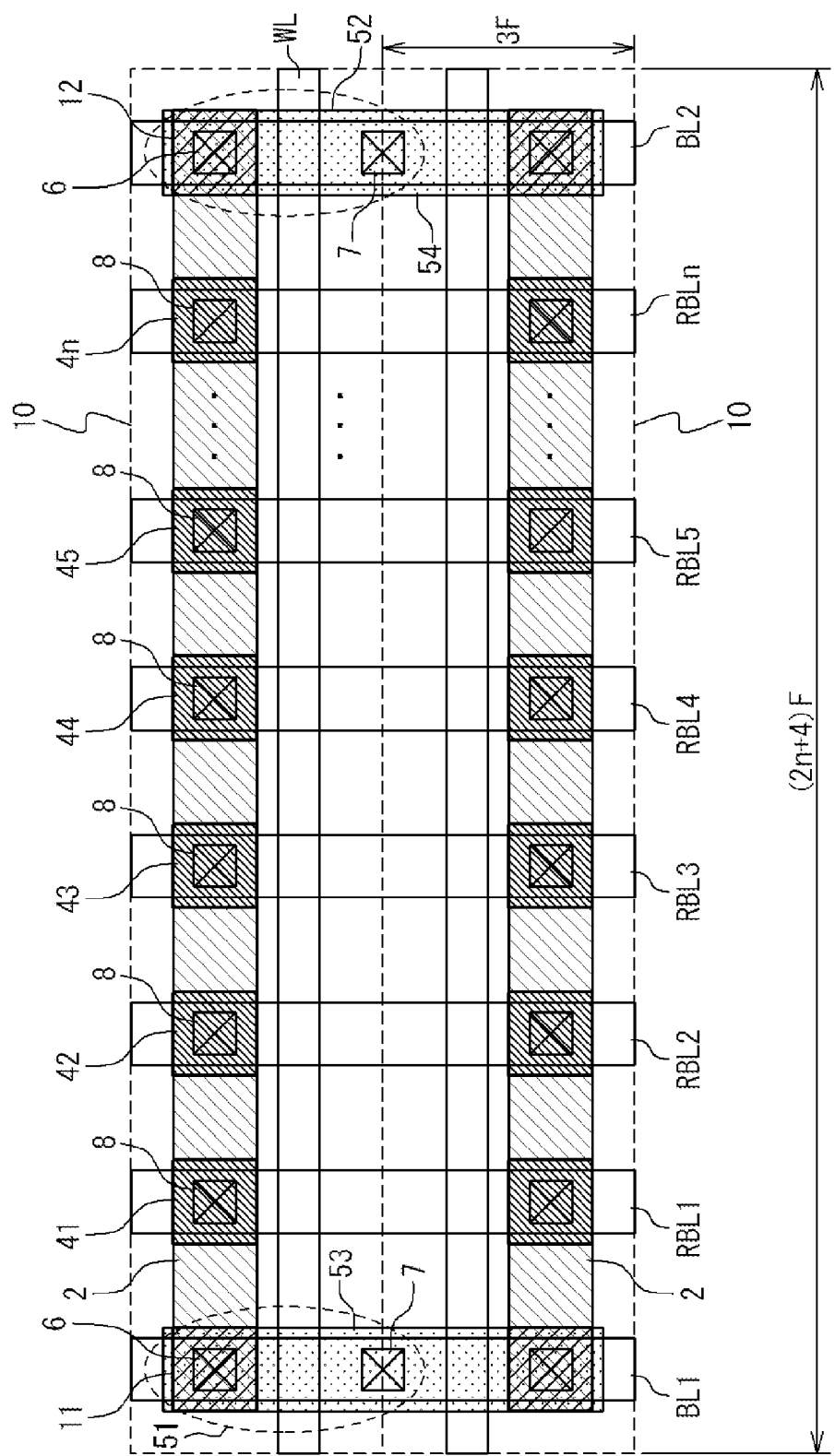
FIG. 15 is a diagram showing an exemplary layout of a memory cell of a magnetic random access memory in a fifth embodiment.

FIG. 15 is a layout diagram showing an exemplary layout of memory cells of an MRAM of a fifth embodiment. In the fifth embodiment, n MTJs (that is, n reference layers 41 to 43 and n tunnel barrier films 31 to 33) are provided for the magnetic recording layer 2, where n is an integer equal to or more than two; it should be noted that three MTJs (that is, three reference layers 41 to 43 and three tunnel barrier films 31 to 33) are provided for the magnetic recording layer 2 in the first to fourth embodiment. The reference layers 41 to 4n are connected to read bitlines RBL1 to RBLn, respectively.

In each memory cell of the MRAM shown in FIG. 15, there are (n+1) positions where the magnetic domain wall is allowed to take, including the position between the magnetization fixed layer 11 and the reference layer 41, the positions of every two adjacent reference layers and the position between the magnetization fixed layer 12 and the reference layer 4n. In the case when the number of the reference layers 41 to 4n is seven, for example, there are eight positions where the magnetic domain wall is allowed to take. In this case, each memory cell stores three-bit data.

The data writing is achieved by moving the magnetic domain wall to any one of these (n+1) positions by flowing a write current, as is the case with the first embodiment. In detail, the memory cell is initialized by moving the magnetic domain wall to the position between the magnetization fixed layer 12 and the reference layer 4n with a write current flowing from the magnetization fixed layer 12 to the magnetization fixed layer 11. This is followed by moving the magnetic domain wall to a desired position with a write current flowing from the magnetization fixed layer 11 to the magnetization fixed layer 12, if the desired position of the magnetic domain wall is not the position between the magnetization fixed layer 12 and the reference layer 4n.

The data reading is achieved by flowing read currents through the n MTJs provided for the magnetic recording layer 2. Data identification based on the read currents may be achieved by comparing the respective read currents flowing through the read bitlines RBL1 to RBLn with a read reference current, in the same way as the first embodiment. Alternatively, data identification may be achieved by comparing the current flown from the read bitlines RBL1 to RBLn to the write bitline BL1 (or BL2) with a read reference current, in the same way as the second embodiment.

It should be noted that, although n MTJs are provided for the magnetic recording layer 2 in this embodiment, the structure in which three MTJs are provided for the magnetic recording layer 2 is most preferable, since the area of the memory cell per bit can be minimized in this structure.

Although various embodiments are described above, the present invention should not be interpreted as being limited to the above-describe embodiments. The present invention may be implemented with various modifications which are obvious to the person skilled in the art. It should be also noted that two or more of the above-described embodiments may be combined if there is no technical inconsistency. For example, the layouts of the magnetic random access memories of the third and fourth embodiments are applicable to the magnetic random access memories of other embodiments.

What is claimed is:

1. A semiconductor device, comprising:
    a memory cell including:
        a magnetic recording layer formed of ferromagnetic material;
        first and second magnetization fixed layers coupled to said magnetic recording layer;
        a plurality of reference layers opposed to said magnetic recording layer; and
        a plurality of tunnel barrier films respectively inserted between said magnetic recording layer and said plurality of reference layers,
    wherein said first magnetization fixed layer has a magnetization fixed in a first direction;
    wherein said second magnetization fixed layer has a magnetization fixed in a second direction opposite to first direction,
    wherein said plurality of reference layers each have a magnetization fixed in said first direction or said second direction, and
    wherein said plurality of reference layers and said plurality of tunnel barrier layers are positioned between said first and second magnetization fixed layers.

2. The semiconductor device according to claim 1, further comprising:
    a write circuit which flows a write current between said first and second magnetization fixed layers,
    wherein data writing into said memory cell is achieved by moving a magnetic domain wall of said magnetic recording layer to a desired position selected from a set of positions including: a position between said first magnetization fixed layer and a first closest reference layer; a position between every adjacent two of said plurality of reference layers; and a position between a second closest reference layer and said second magnetization fixed layer, and
    wherein said first closest reference layer is closest to said first magnetization fixed layer out of said plurality of said reference layers, and said second closest reference layer is closest to said second magnetization fixed layer out of said plurality of said reference layers.

3. The semiconductor device according to claim 2, wherein at least one of a current level of said write current generated by said write circuit and a length of time during which said write current is flown is controlled.

4. The semiconductor device according to claim 1, further comprising:
    a write circuit configured to flow a first write current from said second magnetization fixed layer to said first magnetization fixed layer and to flow a second write current from said first magnetization fixed layer to said second magnetization fixed layer, wherein said memory cell stores data by positioning a magnetic domain wall at any one of a first position between a first closest reference layer and said first magnetization fixed layer, a second position between every adjacent two of said plurality of reference layers; and a third position between a second closest reference layer and said second magnetization fixed layer,
    wherein said first closest reference layer is closest to said first magnetization fixed layer out of said plurality of said reference layers, and said second closest reference layer is closest to said second magnetization fixed layer out of said plurality of said reference layers,
    wherein data writing of data corresponding to said third position is achieved by moving said magnetic domain wall to said third position with said first write current, and
    wherein data writings of data corresponding to said first and second positions are achieved by moving said magnetic domain wall to said first and second positions, respectively, with said second write current after moving said magnetic domain wall to said third position with said first write current.

5. The semiconductor device according to claim 1, further comprising:
    a read circuit flowing read currents through a plurality of magnetic tunnel junctions including said plurality of reference layers and said plurality of tunnel barrier films,
    wherein said read circuit identifies data stored in said memory cell based on said read currents.

6. The semiconductor device according to claim 5, wherein said read circuit identifies the data stored in said memory cell by comparing each of said read currents flowing through said plurality of magnetic tunnel junctions with a read reference current.

7. The semiconductor device according to claim 1, wherein the number of said plurality of reference layer is three and the number of said plurality of tunnel barrier layer is three.

8. The semiconductor device according to claim 1, further comprising:
    first and second write bitlines; and
    a plurality of read bitlines connected to said plurality of reference layers, respectively, and disposed in parallel to said first and second write bitlines between said first and second write bitlines,
    wherein said memory cell further includes:
    a first MOS transistor having a drain connected to said first magnetization fixed layer and a source connected to said first write bitline; and
    a second MOS transistor having a drain connected to said second magnetization fixed layer and a source connected to said second write bitline,
    wherein a first diffusion layer and a word line disposed to intersect said first diffusion layer form said first MOS transistor,
    wherein said plurality of bitlines includes a first read bitline connected to a first closest reference layer which is closest to said first magnetization fixed layer out of said plurality of reference layers, and wherein said first diffusion layer is disposed to at least reach a region under said first read bitline from a via-contact which connects the source of said first MOS transistor and said first write bitline.

9. The semiconductor device according to claim 8, wherein a second diffusion layer and said word line form said second MOS transistor, wherein said word line is disposed to intersect said second diffusion layer, wherein said plurality of bitlines includes a second read bitline connected to a second closest reference layer which is closest to said second magnetization fixed layer out of said plurality of reference layers, and wherein said second diffusion layer is disposed to at least reach a region under said second read bitline from a via-contact which connects the source of said second MOS transistor and said second write bitline.

10. The semiconductor device according to claim 1, wherein said magnetic recording layer has notches which are positioned at a position between said first magnetization fixed layer and a first closest reference layer; a position between every adjacent two of said plurality of reference layers; and a position between a second closest reference layer and said second magnetization fixed layer, and wherein said first closest reference layer is closest to said first magnetization fixed layer out of said plurality of said reference layers, and said second closest reference layer is closest to said second magnetization fixed layer out of said plurality of said reference layers.

11. The semiconductor device according to claim 1, wherein the plurality of reference layers includes:

a first reference layer connected to a first bitline; and
a second reference layer is connected to a second bitline.

12. The semiconductor device according to claim 1, wherein the plurality of reference layers includes a first reference layer and a second reference layer, wherein the plurality of tunnel barrier films includes a first tunnel barrier film and a second tunnel barrier film, and wherein the first reference layer is disposed over the first tunnel barrier film, and the second reference layer is disposed over the second tunnel barrier film.

13. The semiconductor device according to claim 12, wherein the magnetic recording layer has a magnetization in the first direction below the first reference layer and the second reference layer.

14. The semiconductor device according to claim 12, wherein the magnetic recording layer has a magnetization in the first direction below the first reference layer and a magnetization in the second direction below the second reference layer.

15. The semiconductor device according to claim 12, wherein the first reference layer is adjacent to and spaced apart from the second reference layer.

16. The semiconductor device according to claim 12, wherein the first reference layer is connected to a first bitline and the second reference layer is connected to a second bitline.

17. A magnetic random access memory, comprising:
a memory cell including:
a magnetic recording layer formed of ferromagnetic material;
first and second magnetization fixed layers coupled to said magnetic recording layer;
a plurality of reference layers opposed to said magnetic recording layer; and
a plurality of tunnel barrier films respectively inserted between said magnetic recording layer and said plurality of reference layers,
wherein said first magnetization fixed layer has a magnetization fixed in a first direction;
wherein said second magnetization fixed layer has a magnetization fixed in a second direction opposite to first direction,
wherein said plurality of reference layers each have a magnetization fixed in said first direction or said second direction, and
wherein said plurality of reference layers and said plurality of tunnel barrier layers are positioned between said first and second magnetization fixed layers.

18. A semiconductor device, comprising:
a first magnetization layer having magnetization in a first direction;
a second magnetization layer having magnetization in a second direction;
a magnetic recording layer disposed over the first and second magnetization layers; and
first and second magnetic tunnel junctions between the first and second magnetization layers.

19. The semiconductor device according to claim 18, wherein the first magnetic tunnel junction includes a first reference layer and a first tunnel barrier film, and the second magnetic tunnel junction includes a second reference layer and a second tunnel barrier film.

20. The semiconductor device according to claim 19, wherein the first and second reference layers have a same magnetic direction.

* * * * *